(12) United States Patent
Sekine et al.

(10) Patent No.: US 6,844,570 B2
(45) Date of Patent: Jan. 18, 2005

(54) COMPONENT OF A RADIATION DETECTOR COMPRISING A SUBSTRATE WITH POSITIONING STRUCTURE FOR A PHOTOELECTRIC ELEMENT ARRAY

(75) Inventors: Shigenori Sekine, Gunma (JP); Toshikazu Yanada, Gunma (JP)

(73) Assignee: Nihon Kessho Kogaku Co., Ltd., Gunma (JP)

( * ) Notice: Subject to any disclaimer, the term of this patent is extended or adjusted under 35 U.S.C. 154(b) by 0 days.

(21) Appl. No.: 10/109,871

(22) Filed: Apr. 1, 2002

(65) Prior Publication Data

US 2002/0153492 A1 Oct. 24, 2002

(30) Foreign Application Priority Data

Apr. 11, 2001 (JP) .......................................... 2001-112715
Jun. 28, 2001 (JP) .......................................... 2001-196596
Jan. 25, 2002 (JP) .......................................... 2002-016677

(51) Int. Cl.$^7$ ............................................. H01L 29/26
(52) U.S. Cl. ........................... 257/80; 257/81; 257/82; 257/432; 257/433; 257/443; 257/466; 257/724
(58) Field of Search ............................ 257/79–84, 414, 257/428, 431–434, 436, 443, 448, 466, 678, 680, 723, 724, 730, 773, 911; 438/22, 24, 48, 49, 54, 57, 64, 67, 69, 73, 80, 106, 107, 109, 110, 116, 121, 618, 666, 982

(56) References Cited

U.S. PATENT DOCUMENTS 5,177,593 A * 1/1993 Abe ............................ 257/98
5,534,718 A * 7/1996 Chang ......................... 257/98
6,459,130 B1 * 10/2002 Arndt et al. ................ 257/432
6,507,049 B1 * 1/2003 Yeager et al. ............... 257/100
6,531,328 B1 * 3/2003 Chen ........................... 438/26
6,583,444 B2 * 6/2003 Fjelstad ....................... 257/82
6,599,768 B1 * 7/2003 Chen ........................... 438/22

FOREIGN PATENT DOCUMENTS

| JP | 61256773 A | * 11/1986 | ........... H01L/33/00 |
| JP | 62235787 A | * 10/1987 | ........... H01L/33/00 |
| JP | 01168079 A | * 7/1989 | ........... H01L/33/00 |
| JP | 04087383 A | * 3/1992 | ........... H01L/33/00 |
| JP | 7-333348 | 12/1995 | |
| JP | 11-298012 | 10/1999 | |
| JP | 2001-352094 | 12/2001 | |

* cited by examiner

Primary Examiner—Alonzo Chambliss
(74) Attorney, Agent, or Firm—Sughrue Mion, PLLC

(57) ABSTRACT

In the component of a radiation detector, an upper end face of a pad formation protrusion provided on an upper surface of an MID substrate is equal in height to an upper surface of a photodiode array, first pads are provided on upper surfaces of photodiodes arranged in the photodiode array, respectively, second pads are provided on the upper end face of the pad formation protrusion, a bonding wire is provided between one of the first pads and corresponding one of the second pads, a wiring pattern is provided on the upper surface of the MID substrate, first terminals as many as the second pads and one second terminal are provided on a lower surface of the MID substrate, the second pads and the first terminals are electrically connected to one another in a one-to-one correspondence, and the wiring pattern is electrically connected to the second terminal.

7 Claims, 18 Drawing Sheets

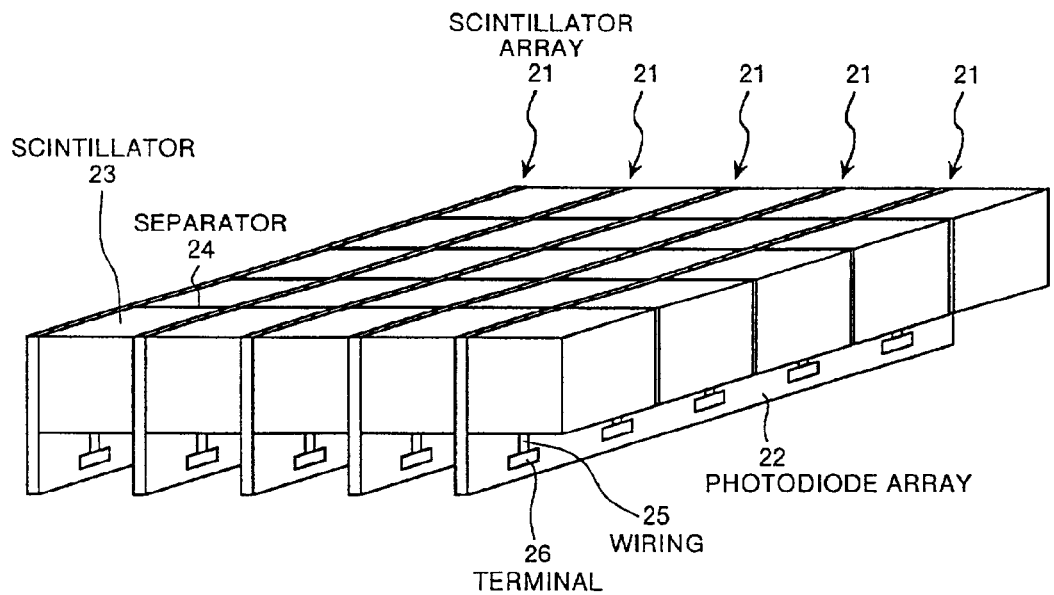
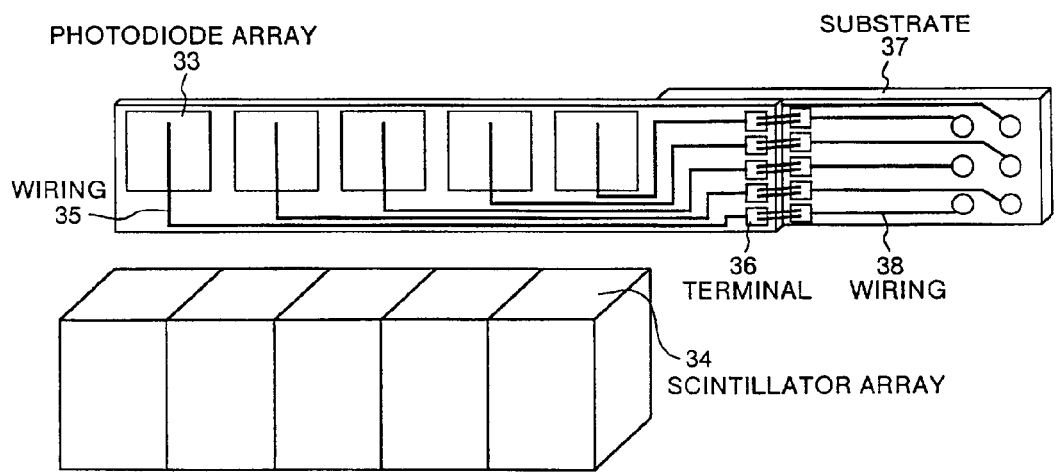

COMPONENT OF A RADIATION DETECTOR COMPRISING A SUBSTRATE WITH POSITIONING STRUCTURE FOR A PHOTOELECTRIC ELEMENT ARRAY

FIELD OF THE INVENTION

The present invention relates to a component of a radiation detector, a radiation detector, and radiation detection apparatus.

BACKGROUND OF THE INVENTION

An X-ray CT system used in a medical institution or the like photographs the internal structure of a subject by applying an X-ray to the subject. Specifically, the X-ray CT system includes an X-ray irradiation source and a radiation detector which is arranged to be opposed to the X-ray irradiation source through a subject and which has an X-ray detection section arranged in a one-dimensional array. The detection section functions to convert a received X-ray into an electrical signal and includes a scintillator which converts the X-ray into a visible light beam and a photodiode which converts the visible light beam into an electrical signal. This radiation detector receives the X-ray which passes through the subject and records the electrical signal obtained based on the received X-ray. While maintaining the positional relationship between the X-ray irradiation source and the radiation detector, the X-ray CT system variously changes an X-ray irradiation angle and repeatedly receives X-rays. The X-ray CT system then conducts processings such as convolution and back-projection to the electrical signals thus obtained, thereby reconstructs the images of the cross-sections (which will be referred to as "slices" hereinafter) of the subject through which the X-rays pass.

Recently, in particular, the development of a multi-slice X-ray CT system which can simultaneously photograph a plurality of slices by one X-ray irradiation is actively underway. The multi-slice X-ray CT system has a plurality of X-ray detection sections, each of which is in the form of an array, which are arranged to correspond to a plurality of slices, respectively, collects X-rays which pass through the respective slices and reconstructs slice images. The multi-slice X-ray CT system is, therefore, required to include a radiation detection apparatus in which each detection section is arranged not in a one-dimensional array but in a two-dimensional array. Photodiodes which constitute each detection section should be arranged two-dimensionally, accordingly.

A conventional radiation detector shown in FIG. 24A ("conventional art 1") is formed by arranging a plurality of single-slice one-dimensional photodiode arrays 102 in parallel on a substrate 101, arranging photodiodes 103 two-dimensionally, and mounting two-dimensional scintillator arrays each having scintillator elements corresponding to the photodiodes on the photodiodes 103, respectively. The first pad 104 of each photodiode 103 is electrically connected to the second pad 105 which is provided on the substrate 101 by a bonding wire 106. An electrical signal output from each photodiode 103 is propagated on a wiring provided on the substrate 101 and output to the outside of the substrate 101.

There is also known a structure in which a plurality of photodiodes distributed in a matrix and wirings corresponding to the photodiodes are integrally formed on a single semiconductor substrate (which structure will be referred to as "conventional art 2" hereinafter). A radiation detector is formed by mounting a two-dimensional scintillator array which includes scintillators corresponding to the respective photodiodes, on the semiconductor substrate on which the photodiodes are thus incorporated.

The conventional art 1 has the following disadvantages. First, according to the conventional art 1, the one-dimensional photodiode arrays 102 are arranged on the plane substrate 101. A difference in height is, therefore, disadvantageously generated between second pads 105 provided on the substrate 101 and the photodiodes 103 by as much as the thickness of each photodiode array 102. If the bonding wires 106 are provided in a state in which such difference is generated, it is necessary to separate the position of each second pad 105 from each photodiode 103 by a predetermined distance in horizontal direction as shown in FIG. 24B. If the position of the second pad 105 is thus separated from the photodiode 103, however, the distance between the photodiode arrays 102 widens. As a result, an area occupied by the photodiodes relative to the entire radiation detector becomes small and the X-ray receiving sensitivity of the detector disadvantageously deteriorates.

In addition, it is necessary to accurately locate the one-dimensional photodiode arrays 102 on the substrate 101. To manufacture such a radiation detector as the conventional art 1, therefore, it is disadvantageously necessary to newly provide a mounting device which fixes the one-dimensional photodiode arrays onto the substrate 101 or to use a special positioning tool.

Moreover, since the conventional art 1 has a structure in which the two-dimensional scintillator arrays are directly arranged on the plural one-dimensional photodiode arrays 102, the conventional art 1 has disadvantages of a small contact area and lowered mechanical strength.

The conventional art 2 has disadvantages, as well. All the photodiodes are mounted on the single semiconductor substrate. For that reason, if even one defective photodiode exists among the photodiodes which constitute the two-dimensional photodiode array, the radiation detector cannot be formed, with the result that the other photodiodes mounted on the semiconductor substrate must be abandoned. The individual photo diodes which constitute the two-dimensional photodiode array are required to be arranged two-dimensionally. A redundant circuit as employed in a DRAM cannot be, therefore, used and yield is disadvantageously quite low with the structure of the conventional art 2.

Further, the conventional art 2 has a structure in which necessary wirings are also mounted on the semiconductor substrate. These wirings are provided to correspond to the photodiodes, respectively. Therefore, as the number of the photodiodes increases, that of the wirings increases. If the number of slices increases, in particular, the number of wirings necessary to output electrical signals to the outside of the substrate increases. To suppress a decrease in an area occupied by the photodiodes on the semiconductor substrate, it is necessary to narrow the width of each wiring. However, if the wirings are narrower, electrical resistance disadvantageously increases and the probability of breaking the wirings disadvantageously increases.

It is noted that some of these disadvantages explained above are not limited to the multi-slice radiation detector but seen in a single-slice radiation detector. If one-dimensional photodiode arrays are arranged on a substrate, for example, the difference in height between pads and photodiodes is disadvantageously generated.

Moreover, these disadvantages occur not only to the radiation detector but also ordinary photo-detectors.

Normally, a photo-detector has a structure of the radiation detector from which scintillators are excluded and the same as the radiation detector in that the two-dimensional photodiodes are arranged. To improve the light receiving sensitivity of the photo-detector, it is preferable that an area occupied by the photodiodes on the substrate is large. However, because of the same disadvantages as those explained above, there is no avoiding narrowing the light receiving area.

SUMMARY OF THE INVENTION

It is an object of the present invention to provide a component of a radiation detector, a radiation detector and a radiation detection apparatus which can maintain the percentage of an area occupied by photodiodes high on a plane on which the photodiodes are arranged and which can be easily manufactured.

The component of a radiation detector according to one aspect of the present invention comprises a substrate, a photoelectric element arranged on a portion on an upper surface of the substrate and having a first pad on a light receiving surface, the photoelectric element generating an electrical signal based on an intensity of received light, a pad formation section arranged on a portion on the upper surface of the substrate and different from the portion on which the photoelectric element is arranged, and a second pad formed on the pad formation section, arranged to form a same plane as a plane of the first pad arranged on the light receiving surface of the photoelectric element, and electrically connected to the first pad.

The component of a radiation detector according to another aspect of the present invention comprises an MID substrate and a photodiode array provided to contact with the MID substrate, a pad formation protrusion provided on an upper surface of the MID substrate on a side contacting with a lower surface of the photodiode array, an upper end face of the pad formation protrusion being equal in height to an upper surface of the photodiode array, first pads provided on upper surfaces of photodiodes of the photodiode array, respectively in a section adjacent the pad formation protrusion, second pads provided on the upper end face of the pad formation protrusion in a section adjacent the first pad, a boding wire provided between one of the first pads and corresponding one of the second pads, a wiring pattern provided on the upper surface of the MID substrate contacting with the photodiode array, first terminals as many as the second pads and one second terminal provided on a lower surface of the MID substrate, wherein the second pads and the first terminals are electrically connected to one another in a one-to-one correspondence, and the wiring pattern is electrically connected to the second terminal.

The component of a radiation detector according to still another aspect of the present invention comprises an MID substrate and a plurality of photodiodes provided to contact with the MID substrate, a positioning groove or protrusion which is provided on an upper surface of the MID substrate on a side contacting with lower surfaces of the photodiodes, and which positions the photodiodes, a pad formation protrusion provided on the upper surface of the MID substrate, an upper end face of the pad formation protrusion being equal in height to upper surfaces of the photodiodes, first pads provided on the upper surfaces of the photodiodes, respectively in sections adjacent the pad formation protrusion, second pads provided on the upper end face of the pad formation protrusion in sections adjacent the first pads, respectively, a boding wire provided between one of the first pads and corresponding one of the second pads, a wiring pattern provided on the upper surface of the MID substrate contacting with the photodiodes, first terminals as many as the second pads and one second terminal provided on a lower surface of the MID substrate, wherein the second pads and the first terminals are electrically connected to one another in a one-to-one correspondence, and the wiring pattern is electrically connected to the second terminal.

The component of a radiation detector according to still another aspect of the present invention comprises a scintillator array, a photodiode array arranged on one side surface of the scintillator array in an array aligned direction, and wirings electrically connected to photodiodes of the photodiode array, respectively, and arranged on a surface of the photodiode array. A terminal end of each of the wirings is present downstream of a contact section with the scintillator array in a light receiving direction.

The component of a radiation detector according to still another aspect of the present invention comprises a scintillator array, a photodiode array arranged on one side surface of the scintillator array in an array aligned direction, and wirings electrically connected to photodiodes of the photodiode array, respectively, and arranged on a surface of the photodiode array. Each of the wirings extends toward downstream of a contact section with the scintillator array in a light receiving direction and then extends in the array aligned direction of the scintillator array; and a terminal end of each of the wirings is present on a lateral position exceeding the contact section with the scintillator array.

The component of a radiation detector according to still another aspect of the present invention comprises an embedding groove section provided on a part of a substrate; a photoelectric element array which includes a plurality of photoelectric elements arranged in a one-dimensional array, and which is embedded into the embedding groove section, a first pad arranged on each of light receiving surfaces of the photoelectric elements, and a second pad provided on the substrate to correspond to the first pad, and electrically connected to the first pad.

The radiation detector according to still another aspect of the present invention comprises the above mentioned component, and a converter arranged on a light receiving surface of the photoelectric element, and converting a received radiation ray into a light beam in a wavelength band which the photoelectric element can convert into an electrical signal.

The radiation detector according to still another aspect of the present invention comprises the above mentioned component, and a scintillator array which is provided on an upper surface of a photodiode array of the component, and which has scintillators provided to correspond to photodiodes of the photodiode array, respectively.

The radiation detector according to still another aspect of the present invention comprises the above mentioned component, and scintillators which are provided on upper surfaces of photodiodes of the component to correspond to the photodiodes, respectively.

The radiation detector according to still another aspect of the present invention comprises the above mentioned component, and a wiring provided on the substrate, wherein the wiring on the substrate is electrically connected to a terminal end of each of wirings arranged on a surface of the photodiode array.

The radiation detector according to still another aspect of the present invention comprises the above mentioned component, and a substrate supporting the component.

The radiation detection apparatus according to still another aspect of the present invention comprises the above mentioned a predetermined number of above-mentioned radiation detectors arranged crosswise.

Other objects and features of this invention will become apparent from the following description with reference to the accompanying drawings.

BRIEF DESCRIPTION OF THE DRAWINGS

FIG. 11 is a schematic perspective view which shows the structure of a radiation detection apparatus in the fifth embodiment, FIG. 12 is a schematic perspective view of a radiation detector in a sixth embodiment in a state in which a photo diode array is separated from a scintillator array.

DETAILED DESCRIPTIONS

The present invention relates to a technique of outputting an electrical signal based on the intensity of a light beam received by each photoelectric element arranged on a partial region on an upper surface of a substrate and having the first pad on a light receiving surface thereof and each of which. More specifically, this invention relates to a component of a radiation detector, a radiation detector and a radiation detection apparatus which can maintain a percentage of an area occupied by photoelectric elements on a plane, on which the photoelectric elements are arranged, to be high and which can be easily manufactured.

Embodiments of the present invention will be explained hereinafter with reference to the drawings. Same or similar sections are detected by the same or similar reference symbols throughout the drawings. It should be noted, however, that the drawings are only typical ones and that the relationship between the thickness and the width of each section, the proportions of thickness of each section and the like differ from actual ones. Needless to say, some sections differ in the relationship of dimensions and rates among the drawings.

Figure 1:
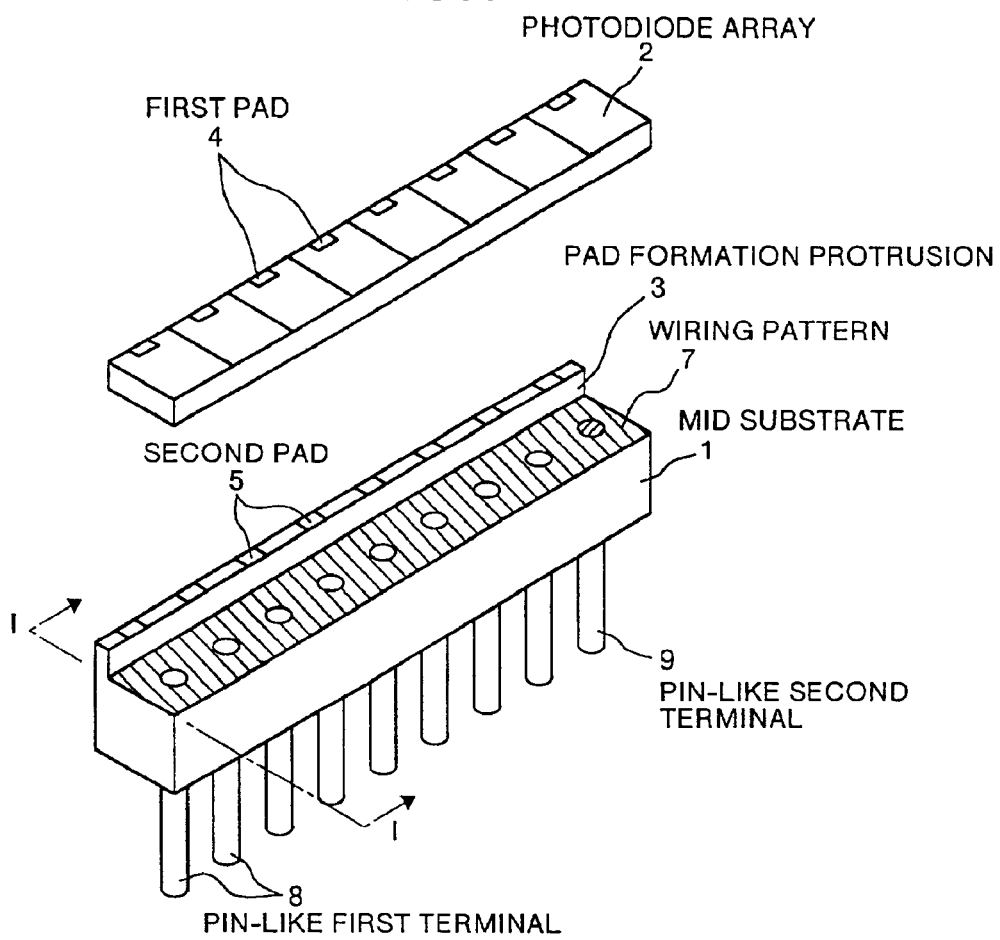
FIG. 1 is a schematic perspective view of a component of a radiation detector in a first embodiment in a state in which an MID substrate is separated from a photodiode array.
Figure 2:
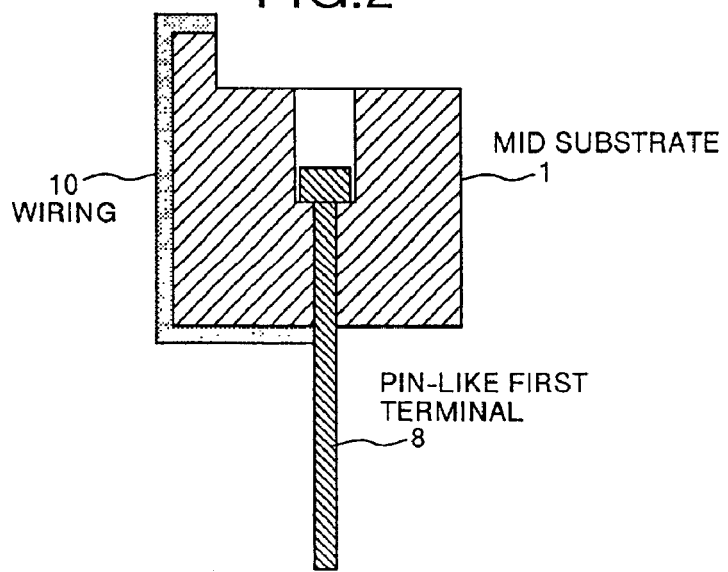
FIG. 2 is a cross-sectional view taken along line I—I shown in FIG. 1.
Figure 3A:
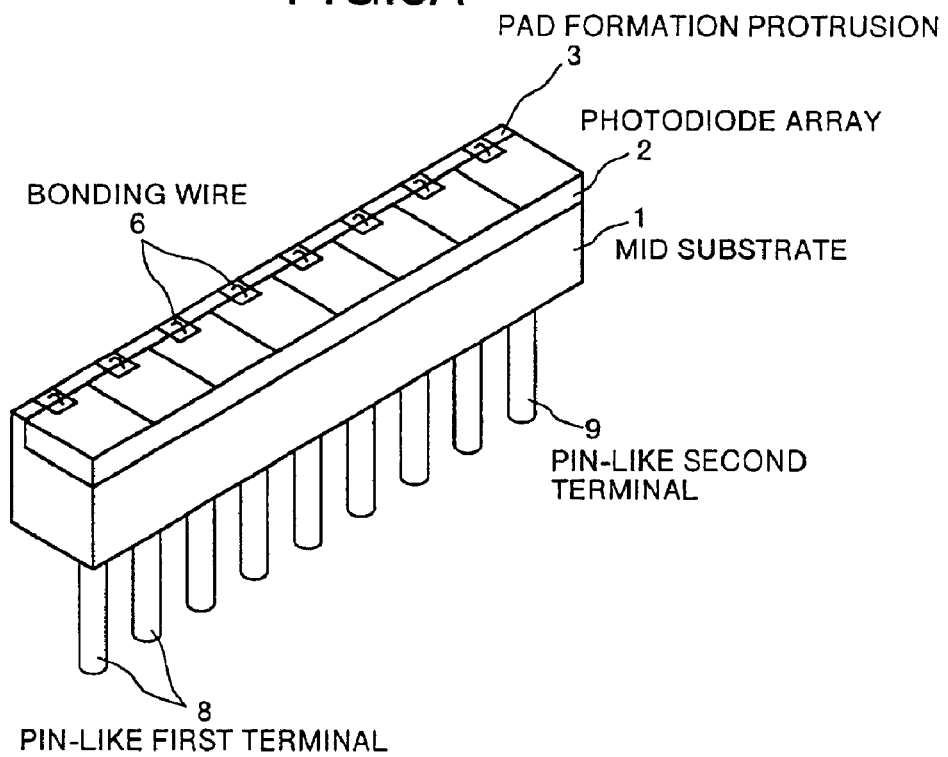
FIG. 3A is a schematic perspective view of the component of a radiation detector in the first embodiment in a state in which the MID substrate and the photodiode array are assembled together.
Figure 3B:
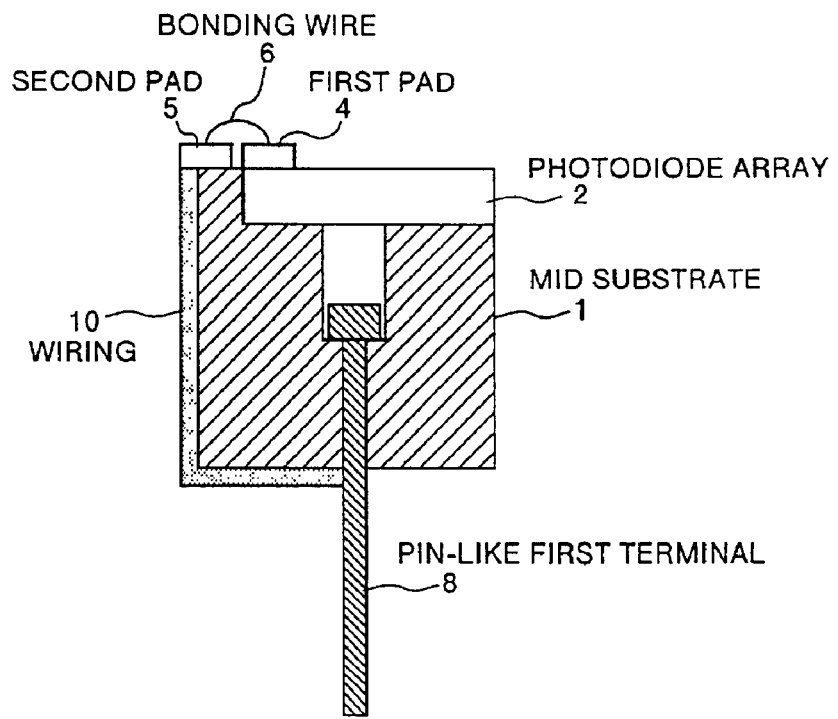
FIG. 3B is a cross-sectional view which shows the manner of the electrical connection of the photodiode array in the assembled state.

A component of a radiation detector in a first embodiment will first be explained. FIG. 1 is a schematic perspective view of a component of a radiation detector in the first embodiment in a state in which an MID (Molded Interconnected Device) substrate 1 and a photodiode array are separated from each other. FIG. 2 is a cross-sectional view taken along line I—I shown in FIG. 1. FIG. 3A is a schematic perspective view of the component of a radiation detector in the first embodiment in a state in which the MID substrate 1 and the photodiode array 2 are assembled together. FIG. 3B is a cross-sectional view which explains the electrical connection of the photodiode array 2 in the assembled state.

As shown in FIGS. 1 to 3, the component of a radiation detector in the first embodiment includes the MID substrate 1 which is three-dimensionally formed and on which three-dimensional wirings are provided, and the photodiode array 2 which is provided in contact with the MID substrate 1. A pad formation protrusion 3 is provided on the upper surface of the MID substrate 1 which surface contacts with the lower surface of the photodiode array 2. The upper end surface of this pad formation protrusion 3 is set to be equal or substantially equal in height to the upper surface of the photodiode array 2. Although not shown in FIGS. 1 to 3, a groove or a protrusion used to position the photodiode array 2 may be provided on the upper surface of the MID substrate 1. If such a positioning groove or protrusion is provided, it is unnecessary to employ a special positioning tool which arranges the photodiode array 2 on the MID substrate 1 in the manufacturing of the component of a radiation detector. In addition, such a positioning groove or protrusion facilitates positioning the photodiode array 2, thereby making it possible to simplify manufacturing steps.

First pads 4 are provided in sections on the upper surfaces of photodiodes of the photodiode array 2 adjacent the pad formation protrusion 3, respectively. In addition, first pads 4 are provided on the upper end face of the pad formation protrusion 3, and second pads 5 are provided in sections on the upper end face of the pad formation protrusion 3 adjacent the first pads 4, respectively. A bonding wire 6 is provided between each first pad 4 and the corresponding second pad 5.

The electrical connection between the first pad 4 and the second pad 5 will be explained with reference to FIG. 3B. As explained above, the first pad 4 and the corresponding second pad 5 are electrically connected to each other by the bonding wire 6. As shown in FIG. 3B, the upper end face of the pad formation protrusion 3 is equal or substantially equal in height to the upper surface of the photodiode array 2. It is, therefore, unnecessary to set the horizontal distance between the first pad 4 and the corresponding second pad 5 wide when the bonding wire 6 is provided, making it possible to narrow the width of the pad formation protrusion 3. To narrow the horizontal distance between the first pad 4 and the second pad 5, it suffices that the first pad 4 and the second pad 5 are equal or substantially equal in height. If this conditions are met, therefore, it is not necessary that the upper surface of the photodiode array 2 is equal or substantially equal in height to the upper end face of the pad formation protrusion 3.

As can be seen from FIG. 3A (1), a wiring pattern 7, e.g., a cathode wiring pattern 7 is provided on the upper surface of the MID substrate 1 which surface contacts with the photodiode array 2. First terminals 8 in the form of, for example, pins, e.g., anode terminals 8 as many as the second pads 5 and one second terminal 9 in the form of, for example, a pin, e.g., a cathode terminal 9 are provided on the lower surface of the MID substrate 1. In addition, the second pads 5 are electrically connected to the first terminals 8, e.g., anode terminals 8 by wirings 10 formed on the MID substrate 1 in a one-to-one correspondence. The wiring pattern 7, e.g., cathode wiring pattern 7 is electrically connected to the second terminal 9, e.g., cathode terminal 9 by, for example, a wiring arranged in a hole formed in the MID substrate 1. As a result, the first pads 4 of the individual photodiodes which constitute the photodiode array 2 are electrically connected to the second pads 5 through the bonding wires 6, respectively. Further, since the second pads 5 are electrically connected to the first terminals 8 through the wirings 10, respectively as shown in FIG. 2, the first pad 4 of each photodiode is electrically connected to the first terminal 8. On the other hand, each photodiode has a cathode electrode on a bottom thereof and the cathode electrode is electrically connected to the second terminal 9 through the wiring pattern 7. While the cathode electrodes of the individual photodiodes are connected to the second terminal 9 in common with the electrodes short-circuited to one another, the first pads 4 of the individual photodiodes are connected to the first terminals 8, respectively, without being short-circuited to one another. Therefore, electrical signals output from the photodiodes can be individually fetched through the corresponding first terminals 8, respectively. This exactly applies to an instance in which the terminals 8 are cathode terminals and the terminal 9 is an anode terminal.

If a radiation detection apparatus is realized according to the above configuration, an area necessary for the wirings used to detect electrical signals generated from the individual photodiodes which constitute the photodiode array 2 may be advantageously small. That is, by providing a three-dimensional wiring structure in which the electrical signals output from the second pads 5 are fetched from the first terminals 8 provided on the lower surface of the MID substrate 1, respectively, it is possible to narrow a gap region between the photodiode arrays compared with a conventional instance in which two-dimensional wirings are provided on the surface of the substrate. If the two-dimensional wirings are provided on the substrate surface as seen in the conventional art, a radiation detection apparatus has a structure in which all the necessary wirings are flatly arranged in the gap regions between the photo diode arrays. It is, therefore, necessary to set the gap regions wide so as to secure necessary wirings. The radiation detection apparatus in the first embodiment can secure a relatively large area occupied by the photodiodes to the conventional area, whereby the effective X-ray receiving surface of the apparatus can be maximized and the detection efficiency thereof can be improved.

FIGS. 1 to 3 show that the number of the photodiodes on the upper surface of the component of a radiation detector, therefore, the number of the second pads 5 is eight and that of the pin-like terminals provided on the rear surface of the component of a radiation detector is nine by way of example. Therefore, the interval of the second pads 5 is not consistent to that of the pin-like terminals and that of the holes. Quite naturally, the number of the photodiodes, that of the second pads 5 and that of the first terminals 8 shown in FIGS. 1 to 3 are given only by way of example. Even if the number of photodiodes is more than or less than eight, the structure shown in FIGS. 1 to 3 can be realized, as well.

The three-dimensional wiring of the component of a radiation detector in the first embodiment is realized by providing the wirings 10 on the MID substrate 1. Alternatively, the three-dimensional wiring may be realized by providing through holes which penetrate the MID substrate 1 and the pad formation protrusion 3. If the through holes are used, it is possible to employ a substrate other than the MID substrate.

A modification of the component of a radiation detector in the first embodiment will be explained now. In this modification, a component of a radiation detector has a structure in which the photodiode array 2 is not used but individual photodiodes separate from one another are arranged on an MID substrate 1.

Namely, the component of a radiation detector in the modification is modified from that in the first embodiment as follows. The photodiode array 2 used in the component of a radiation detector in the first embodiment shown in FIGS. 1 to 3 is changed to a plurality of photodiodes and a groove or a protrusion which positions the respective photodiodes is provided on the upper surface of the MID substrate 1. This positioning groove or protrusion is in the form of a bank which functions as a partition between adjacent channels, whereby optical cross talk caused by a transparent adhesive layer used between the photodiode and the scintillator can be advantageously reduced.

In addition, by providing the positioning groove or protrusion, it is advantageously unnecessary to use a special positioning tool when the individual photodiodes are arranged on the MID substrate 1. Further, such a positioning groove or protrusion can facilitate positioning the photodiodes, thereby advantageously, swiftly manufacture the component of a radiation detector at low cost.

Figure 4:
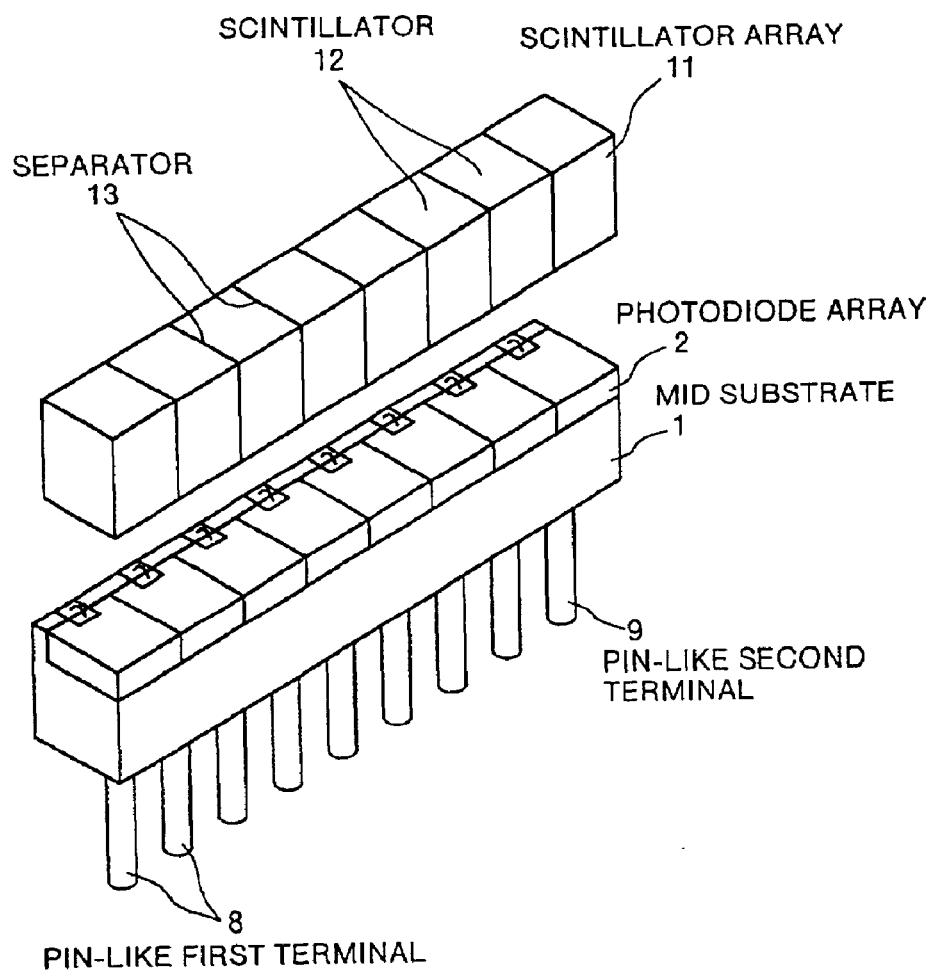
FIG. 4 is a schematic perspective view of a radiation detector in a second embodiment in a state in which a component of a radiation detector is separated from a scintillator array.
Figure 5:
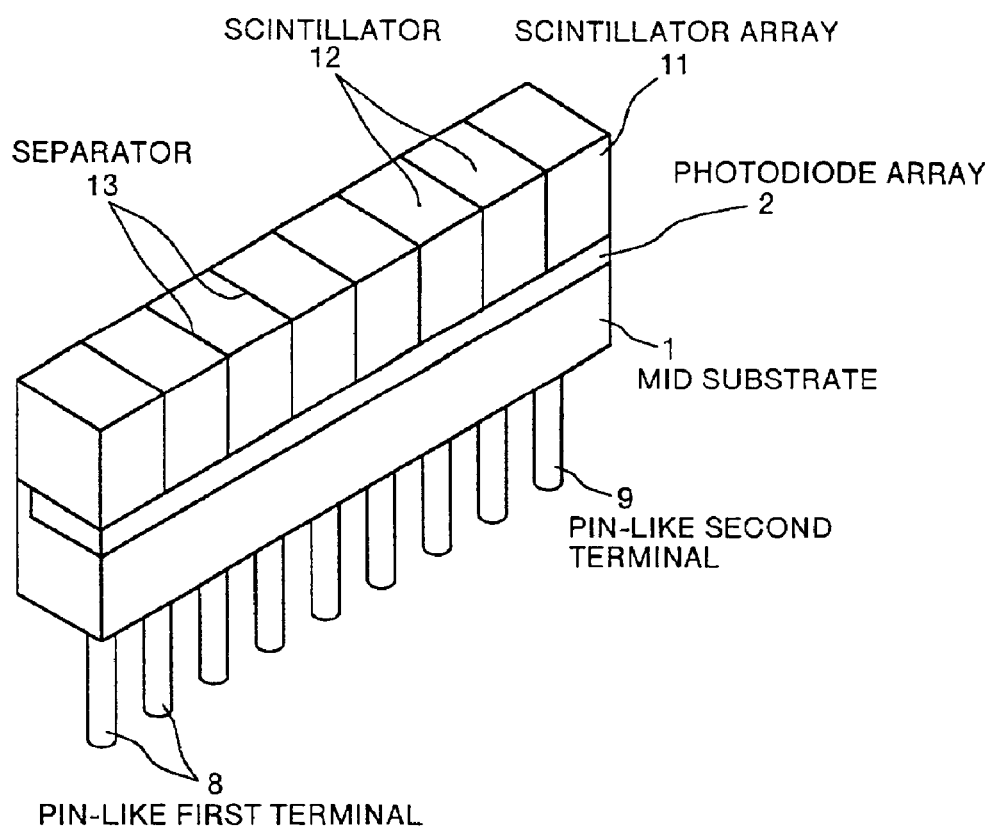
FIG. 5 is a schematic perspective view of the radiation detector in the second embodiment in a state in which the component of a radiation detector and the scintillator array are assembled together.

A radiation detector in a second embodiment will next be described. FIG. 4 is a schematic perspective view of the radiation detector in the second embodiment in a state in which the component of a radiation detector in the first embodiment and a scintillator array are separated from each other. FIG. 5 is a schematic perspective view of the radiation detector in the second embodiment in a state in which the component of a radiation detector in the first embodiment and the scintillator are assembled together.

As shown in FIGS. 4 and 5, the radiation detector in the second embodiment includes the component of a radiation detector in the first embodiment shown in FIG. 3 and the scintillator array 11 which is provided on the upper surface of the photodiode array 2 of the component of a radiation detector so that scintillators correspond to the photodiodes, respectively. This scintillator array 11 consists of scintillators 12 and separators 13. In addition, the component of a radiation detector and the scintillator array 11 are fixed to each other by optical adhesive.

A modification of the radiation detector according to the second embodiment includes the component of a radiation detector in the modification of the first embodiment and scintillators arranged on the upper surface of the photodiodes of the component of a radiation detectors to correspond to the photodiodes, respectively. As explained above, the component of a radiation detector in the modification of the first embodiment is modified such that the photodiode array 2 used in the component of a radiation detector in the first embodiment shown in FIGS. 1 to 3 is changed to a plurality of photodiodes and that a groove or protrusion which positions the photodiodes is provided on the upper surface of the MID substrate 1. The remaining configuration of the radiation detector in this modification is the same as that of the radiation detector in the second embodiment shown in FIGS. 4 and 5. According to the radiation detector in the modification, the positioning protrusion is in the form of a bank and functions as a partition between adjacent channels, whereby optical cross talk caused by a transparent adhesive layer used between the photodiode and the scintillator can be advantageously reduced.

Figure 6:
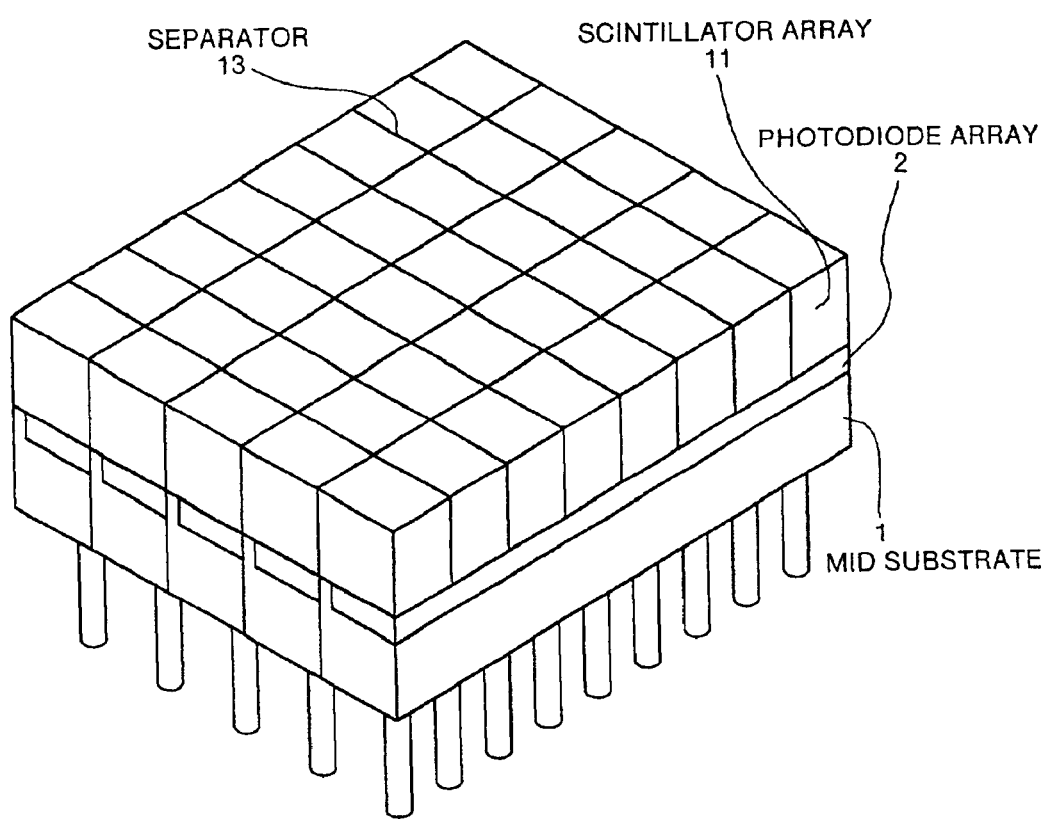
FIG. 6 is a schematic perspective view which shows the structure of a radiation detection apparatus in a third embodiment.
Figure 7:
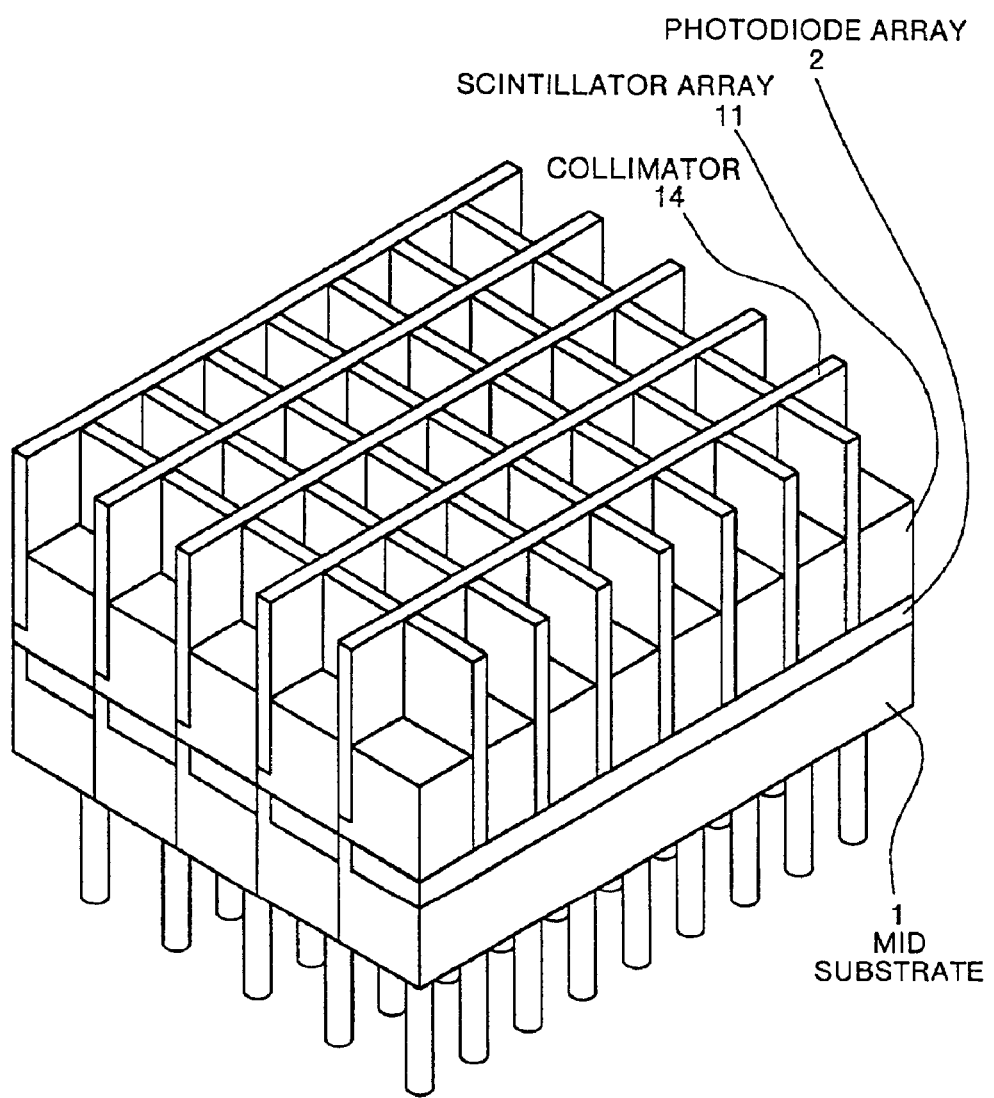
FIG. 7 is a schematic perspective view of the radiation detection apparatus in the third embodiment in which collimators are additionally arranged.

A radiation detection apparatus in a third embodiment will be explained now. FIG. 6 is a schematic perspective view of the radiation detection apparatus in the third embodiment which apparatus is obtained by arranging a predetermined number of radiation detectors shown in FIG. 5 in a matrix. FIG. 7 is a schematic perspective view of the radiation detection apparatus into which a collimator 14 is incorporated. As shown in FIGS. 6 and 7, the radiation detection apparatus has a structure in which a radiation detection section consisting of photodiodes and scintillators is arranged two-dimensionally. This structure enables the radiation detection apparatus to be used not only in a single-slice X-ray CT system but also in a multi-slice X-ray CT system.

As explained above, in the first to third embodiments, the difference in height between the upper surface of each photodiode and the surface of the primary substrate is eliminated to minimize space necessary for a wire bonding, the output terminals are arranged below the primary substrate and the output terminals are connected to wire bonding pads by three-dimensional wirings, thereby making the radiation detector small in size. As shown in FIG. 6 or 7, it is possible to arrange the radiation detectors without gaps formed therebetween and, therefore, maximize the effective X-ray receiving area of, for example, the X-ray CT system per unit area and improve the detection efficiency thereof.

Concrete examples of the third embodiment will be explained below. As each photodiode 2 shown in FIG. 1, a PIN type silicon photodiode having a length of 13.6 mm, a width of 1.35 mm and a thickness of 0.3 mm is used. The MID substrate 1 shown in FIG. 1 is made of liquid crystal polymer manufactured by Polyplastics Co., Ltd. The MID substrate 1 has an entire length of 13.6 mm, a thickness of 1.5 mm and a width of is 1.5 mm. The protrusion has a length of 13.6 mm, a height of 0.3 mm and a width of 0.14 mm. Each pin-like output terminal has a diameter of 0.46 mm. The wirings in a wire bonding pad section, a vertical wiring section and a through hole section are all copper-plated, nickel-plated or gold-plated. As each scintillator shown in FIG. 4, a scintillator made of $CdWO_4$ and having a length of 13.6 mm, a width of 1.5 mm and a thickness of 2 mm are used.

The photodiodes and the MID substrate 1 are assembled together to thereby manufacture the component of a radiation detector according to the present invention. In addition, the scintillators are incorporated into the radiator detector component to thereby manufacture the radiation detector according to the present invention. Further, a predetermined number of the radiation detectors are assembled together to thereby manufacture the two-dimensional radiation detection apparatus.

According to the present invention, arbitrary resin which enables the MID substrate 1 to be formed three-dimensionally can be replaced by liquid polymer manufactured by Polyplastics Co., Ltd., the wirings on the MID substrate 1 can be formed by printing a conductive material on the MID substrate 1 or transferring a copper foil thereon instead of plating. The pin-like output terminals may be replaced by through holes or solder bumps. The material of the scintillators is typically exemplified by CsI, NaI, $Bi_4Ge_3O_{12}$, $BaF_2$, $Gd_2SiO_5$, $Lu_2SiO_5$ or various type of ceramics. Basically, any material which can convert an incident radiation ray into a light beam is available as the material of the scintillators.

Figure 8A:
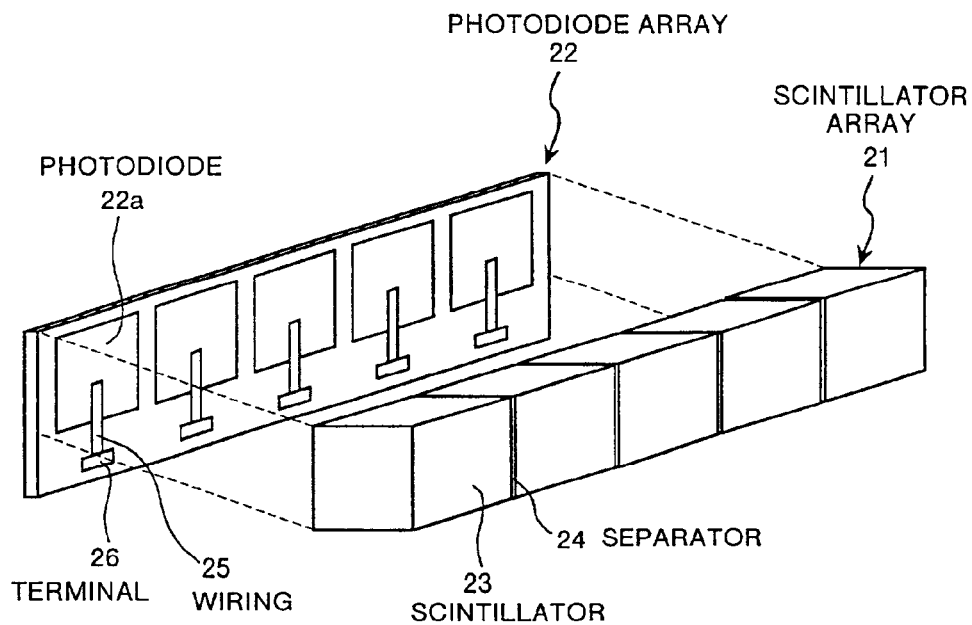
FIG. 8A is a schematic perspective view of a component of a radiation detector in a fourth embodiment in a state in which a photodiode array is separated from a scintillator array.
Figure 8B:
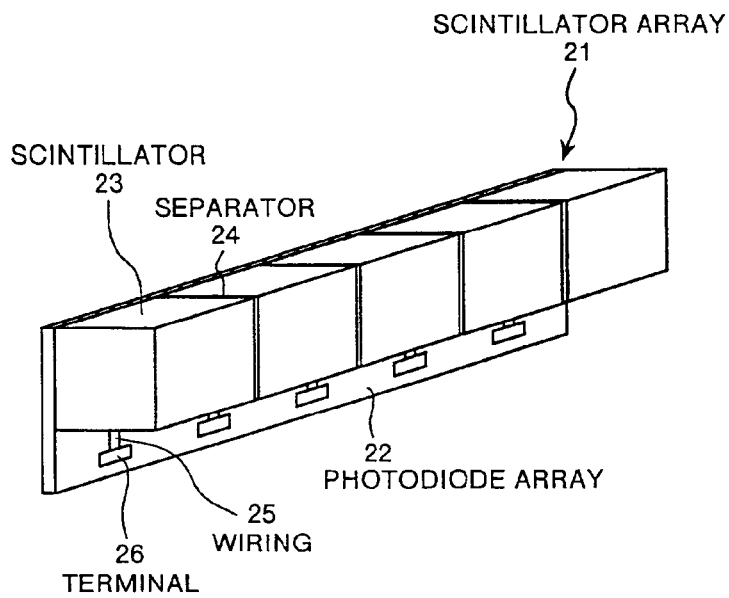
FIG. 8B is a schematic perspective view which shows a state in which the component of a radiation detector is assembled.

A component of a radiation detector in a fourth embodiment will be explained now. FIG. 8A is a schematic perspective view which shows the structure of the component of a radiation detector in the fourth embodiment in a state in which a photodiode array 22 and a scintillator array 21 are separated from each other. FIG. 8B is a schematic perspective view of the component of a radiation detector in a state in which the photodiode array 22 contacts with the scintillator array 21. As shown in FIG. 8B, in the component of a radiation detector in the fourth embodiment, the photodiode array 22 is arranged on one side surface of the scintillator array 21 in the array aligned direction of the scintillator array 21. The scintillator array 21 and the photodiode array 22 are bonded to each other by optical adhesive. The scintillator array 21 consists of a plurality of scintillators 23 and separators 24. As shown in FIG. 8A, a plurality of photodiodes 22a are formed on the photodiode array 22 in sections facing the scintillators 23, respectively. In addition, wirings 25 are electrically connected to the respective photodiodes 22a. The wirings 25 are arranged on the surface of the photodiode array 22 and the terminal ends thereof are located downstream of the section in which the photodiode array 22 contacts with the scintillator array 21 in a light receiving direction, i.e., a lower side in FIG. 8A and FIG. 8B. Terminals 26 are formed at the wirings 25, respectively.

In the fourth embodiment, the photodiode array 22 is not located downstream of the scintillator array 21 in the light receiving direction but arranged on one side surface of the scintillator array 21 in the array aligned direction of the scintillator array 21. However, each photodiode 22a included in the photodiode array 22 does not directly converts an X-ray into an electrical signal. Specifically, each photodiode 22a receives a visible light beam dispersed radially from an atom constituting each scintillator 23 due to the incidence of X-rays on the scintillator array 21. Therefore, even if the photodiode 22a is not located on the downstream side in the light receiving direction with respect to X-ray, the photodiode 22a can surely receive the visible light beam.

As can be seen, by arranging the photodiode array 22 on one side surface of the scintillator array 21 in the array aligned direction, the following advantages are obtained. The thickness of the photodiode array 22 is at most about several hundred micrometers. If the component in the fourth embodiment is viewed from the light receiving direction, therefore, an area occupied by the photodiode array 22 can be made far smaller than that occupied by the scintillator array 21. As a result, if a plurality of components are arranged to constitute a radiation detector, these components can be arranged without generating gaps therebetween. Therefore, if the radiation detector is used in, for example, an X-ray CT system, the effective X-ray receiving area of the X-ray CT system per unit area can be advantageously increased and the detection efficiency thereof can be advantageously improved.

Figure 9:
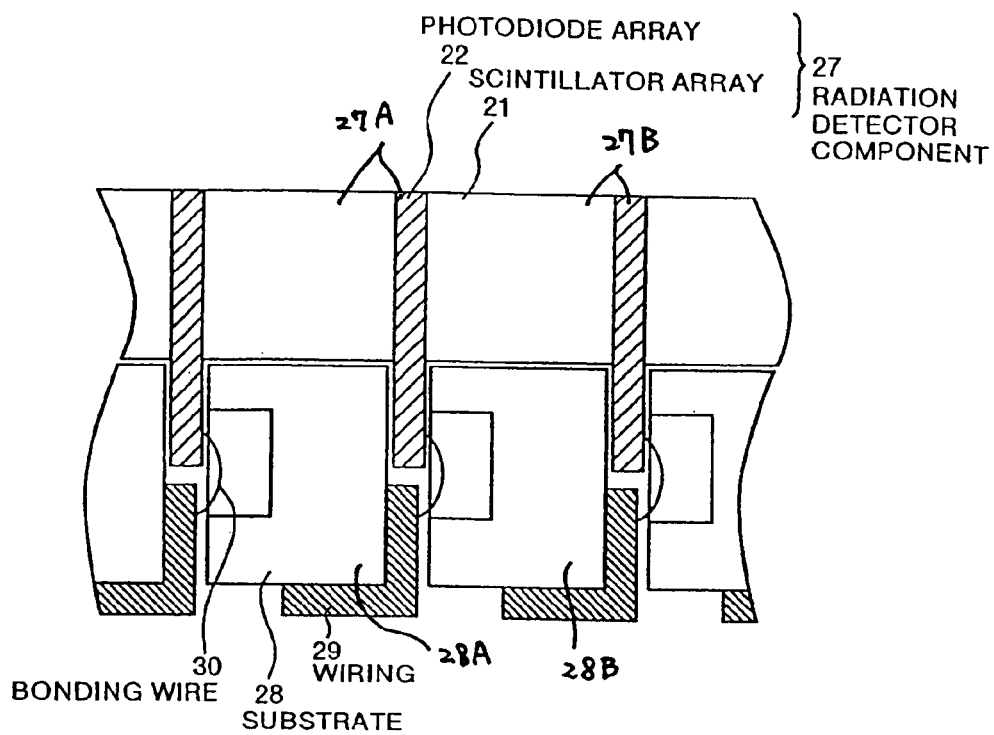
FIG. 9 is a schematic cross-sectional view which shows the structure of a radiation detector in a fifth embodiment.

A radiation detector in a fifth embodiment will be explained now. FIG. 9 is a schematic cross-sectional view which shows a state in which the radiation detector includes a plurality of components explained in connection to the fourth embodiment. As shown in FIG. 9, in the radiation detector in the fifth embodiment, components 27 as shown in FIG. 8A are fixed onto and thereby supported by substrates 28, respectively. Each substrate 28 is almost equal in length to a scintillator array 21 in the array aligned direction of the scintillator array 21 and almost equal in width to the scintillator array 21 in a direction at right angle to the array aligned direction. The height of the substrate 28 is not limited to a specific value. Wirings 29 are provided on the substrates 28 to correspond to respective photodiodes.

An assembly method of the radiation detector shown in FIG. 9 will be explained. If the radiation detector is assembled into the structure shown in FIG. 9, in order to facilitate the operation of bonding wire, the wirings 29 provided on the substrates 28 are electrically connected to the terminals 26 of wirings arranged on the surfaces of the photodiode arrays 22 of the adjacent components 27 by bonding wires 30, respectively. Recesses are formed in the substrates 28 in sections corresponding to the positions of the bonding wires 30, respectively.

To assemble the components into the state shown in FIG. 9, the components are sequentially assembled together not in a horizontal direction but in a vertical direction while placing the left side of FIG. 9 down. That is, a component (to be denoted by reference symbols 27A for the convenience of explanation) is fixedly overlapped with a substrate (to be denoted by reference symbols 28A for the convenience of explanation). The terminal 26 of the component 27A thus overlapped with the substrate 28A is electrically connected to the wiring 29 provided on the substrate 28A by the bonding wire 30. A substrate 28B is fixedly overlapped with a substrate 28A. Thereafter, a component 27B is fixedly overlapped with a component 27A substrate 28C and the terminal 26 of the component 27B is electrically connected to the wiring 29 of the substrate 28B by bonding wires 30. This operation is repeated to thereby form a two-dimensional radiation detection apparatus which employs a predetermined number of components.

If necessary, two or more two-dimensional radiation detection apparatuses thus assembled can be arranged in the array aligned direction of the scintillator arrays 21 to thereby form a two-dimensional radiation detection apparatus which has a wider effective area.

The substrates 28 can be glass epoxy substrates, ceramic substrates, liquid crystal polymer substrates, substrates consisting of epoxy resin molded matters, the other plastic substrates or the like.

Figure 10:
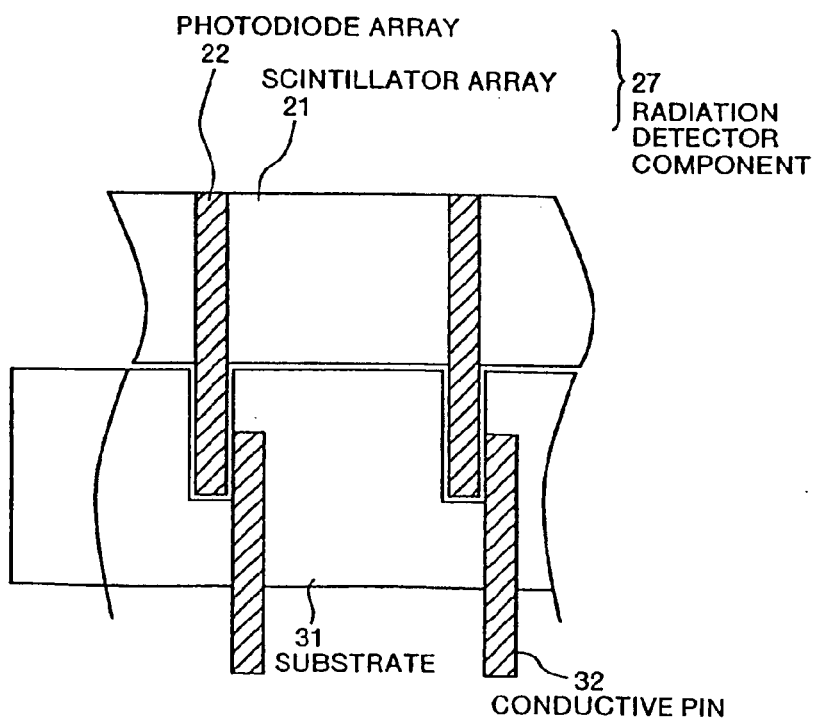
FIG. 10 is a schematic cross-sectional view which shows the structure of a modification of the radiation detector in the fifth embodiment.

The radiation detector shown in FIG. 9 consists of a plurality of components 27 and a corresponding number of substrates 28. As shown in FIG. 10, substrates 31 continuously provided by the length of a predetermined number of radiation detectors in a direction at right angle to the array aligned direction of the scintillator arrays 22. In this instance, grooves which contain the sections of the photodiode arrays 22 extending below the contact sections between the photodiode arrays 22 and the scintillator arrays 21 of the respective components 27, are provided in the upper surface of the substrates 31. In addition, conductive pins 32 are embedded into the substrates 31 so that the conductive pins 32 can be electrically connected to the terminals 26 of the wirings arranged on the surfaces of the photodiode arrays 22, respectively.

FIG. 11 is a schematic perspective view of a two-dimensional radiation detection apparatus obtained by arranging and coupling a predetermined number of radiation detectors shown in FIG. 9 or 10 from which the sections of the substrates 28 are excluded.

As explained above, in the component 27 and the radiation detector, each wiring 25 which is electrically connected to each photodiode of the photodiode array 22 is pulled out on the downstream side of the radiation detector in the light receiving direction, i.e., on the lower side of the radiation detector. Therefore, as shown in FIG. 11, it is possible to arrange the radiation detectors without gaps formed therebetween. This arrangement, therefore, enables the effective X-ray receiving area of, for example, an X-ray CT system per unit area to be maximized and the detection efficiency thereof to be improved.

Figure 13:
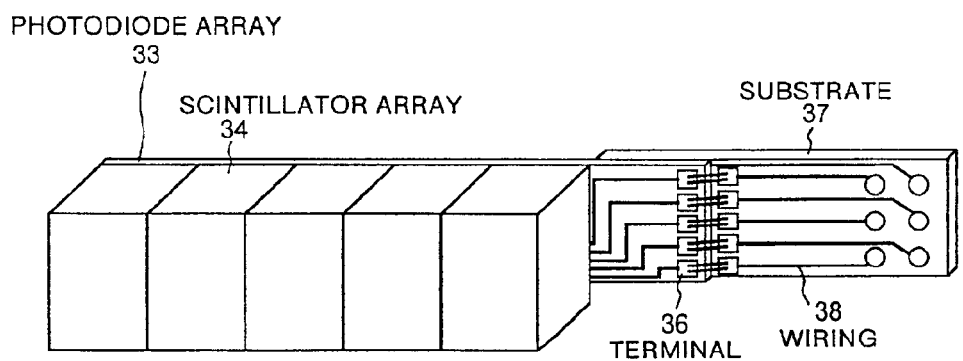
FIG. 13 is a schematic perspective view which shows the structure of the radiation detector in the sixth embodiment.

FIGS. 12 and 13 are schematic perspective views which explain a component of a radiation detector and a radiation detector in a sixth embodiment according to the present invention. FIG. 12 is a schematic perspective view which shows a state in which a photodiode array 33 and a scintillator array 34 are separated from each other. FIG. 13 is a perspective view which shows a state in which the photodiode array 33 and the scintillator array 34 are assembled together.

As is obvious from FIGS. 12 and 13, in an instance of the component and the radiation detector in the sixth embodiment, the photodiode array 33 is arranged on one side surface of the scintillator array 34 in the array aligned direction of the scintillator array 34 and fixed to the scintillator array 34 by optical adhesive. Wirings 35 are electrically connected to the photodiodes of this photodiode array 33, respectively. The wirings 35 are extended downstream of the contact sections between the photodiode array 33 and the scintillator array 34 in the light receiving direction and consequently extended in the array aligned direction of the scintillator array 34. The terminal ends of the respective wirings 35 are present at lateral positions exceeding the contact sections between the photodiode array 33 and the scintillator array 34 to thereby form terminals 36, respectively. A part of a substrate 37 is fixedly attached to the rear surface of the photodiode array 33 and wirings 38 are provided on the other section of the substrate 37. The wirings 38 are electrically connected to the terminals 36 by bonding wires, respectively.

The component according to the sixth embodiment has following advantages are obtained with respect to the wirings 35 and the terminals 36 pulled out from the respective photodiodes included in the photodiode array 33. Since the photodiode array 33 is arranged on the side surface of the scintillator array 34, only the thickness of the photodiode array 33 influences an effective X-ray receiving area. It is, therefore, possible to make the area of the surface of the photodiode array 33 on which the photodiodes are arranged, large. This makes it possible to greatly extend the photodiode array 33 toward the downstream side in the light receiving direction. On the photodiode array 33, the wirings 35 can be arranged in the region other than the region in which the respective photodiodes are arranged. As a result, by setting the area of the photodiode array 33 large, the region in which the wirings 35 and the terminals 36 are arranged can be set large. Accordingly, it is not necessary to provide microscopic wirings as seen in the conventional art and it is thereby possible to prevent disadvantages such as the breaking of the wirings and the increase of resistance.

If a radiation detector is manufactured using the components in the sixth embodiment, each substrate 37 can be provided on the section of the photodiode array 33 which does not contact with the scintillator array 34 as shown in FIGS. 12 and 13. As the other manufacturing method, a substrate which supports the component may be provided below the component. In this instance, it is not necessary to electrically connect the terminals 26 on the photodiode array 33 to the wirings 29 of the substrate or the conductive pins 32 as shown in FIGS. 9 and 10.

Figure 14:
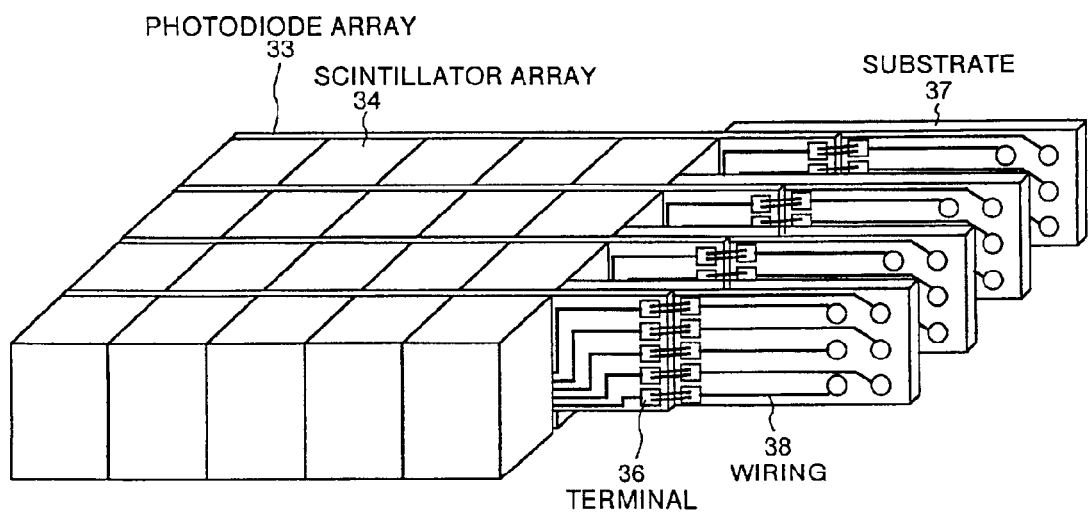
FIG. 14 is a schematic perspective view which shows the structure of a radiation detection apparatus which employs the radiation detectors in the sixth embodiment.

If a two-dimensional radiation detection apparatus is manufactured using these radiation detectors, an arbitrary number of radiation detectors can be coupled to one another in a direction at right angle to the array aligned direction of the scintillator arrays 34 as shown in the schematic perspective view of FIG. 14. In addition, by pulling out the terminals 36 to the both sides of the apparatus, it is possible to arrange two radiation detection apparatuses in the array aligned direction of the scintillator arrays 34, thereby making it possible to further increase the effective X-ray area of the apparatus.

Figure 15A:
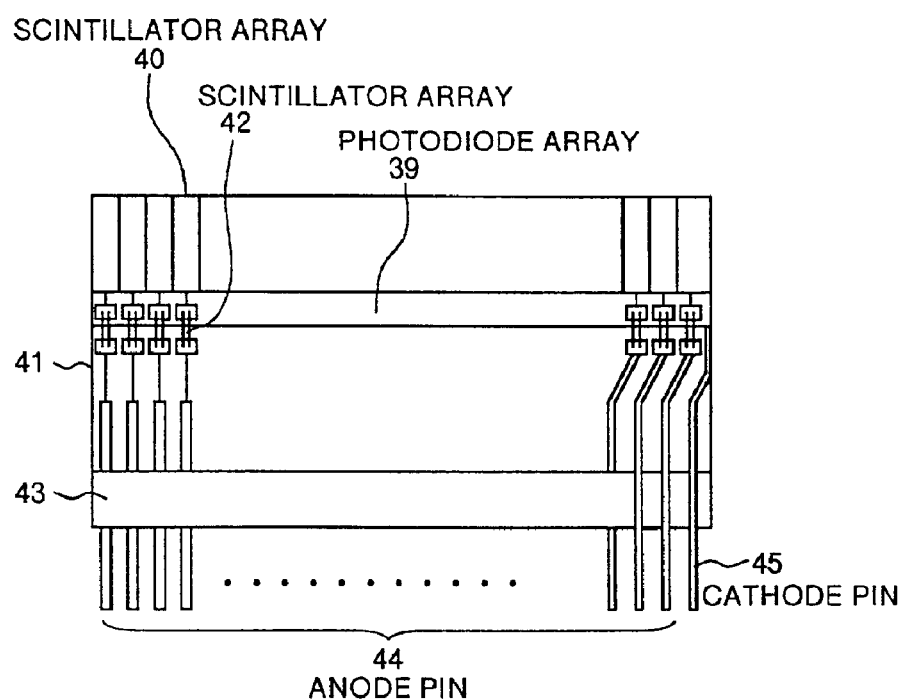
FIG. 15A and FIG. 15B are schematic cross-sectional views of the radiation detection apparatus obtained in the embodiments.
Figure 15B:
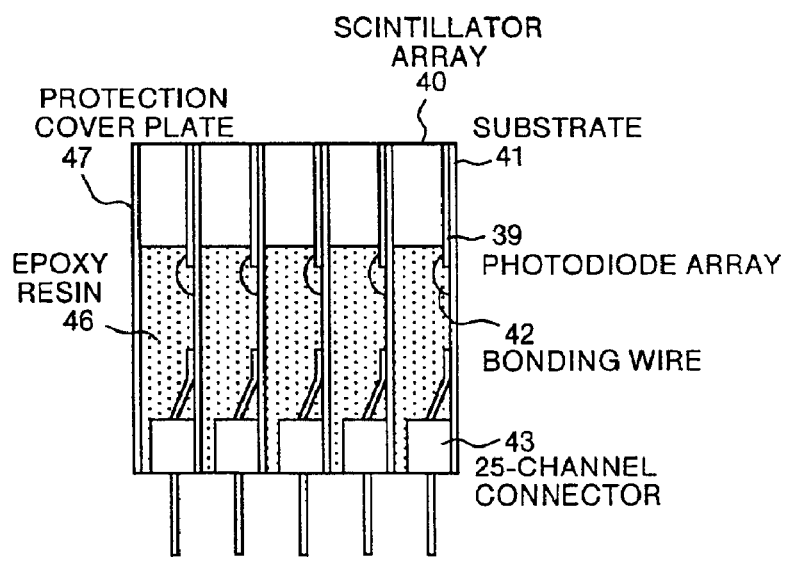

Concrete example of the sixth embodiment will be explained below. FIG. 15A is a schematic cross-sectional view of a two-dimensional radiation detection apparatus in a state in which the apparatus is cut out in the array aligned direction of the scintillator arrays of radiation detectors. FIG. 15B is a schematic cross-sectional view of the two-dimensional radiation detection apparatus in a state in which the apparatus is cut out in a direction perpendicular to FIG. 15A. As shown in FIGS. 15A and 15B, as each photodiode array 39, a 24-channel photodiode array (a length of 38.05 mm, a width of 6.0 mm, a thickness of 0.3 mm, a light receiving section size of 1.18 mm×3.8 mm, a channel pitch of 1.5875 mm) consisting of PIN type silicon photodiodes are used. As each scintillator array 40, an array made of $CdWO_4$ having a length of 38.05 mm, a width of 5.0 mm and a thickness of 2.19 mm (a channel size of 1.33 mm×4.0 mm×2.0 mm) is used. As each substrate 41, a glass epoxy substrate having a thickness of 0.2 mm is used. The wirings of each photodiode array are connected to those of the substrate 41 by bonding wires 42, respectively. As output terminals from the substrate wirings, a 25-channel connector 43 having a pitch of 1.27 mm is used. Among 25 channels, 24 channels are anode pins 44 and one channel is a cathode pin 45. Five 24-channel detector substrates are stacked, epoxy resin 46 is filled into the space sections thereof and protection cover plates 47 are provided on the sides on which no substrates are provided, respectively, thereby manufacturing a prototype 120-channel two-dimensional X-ray detector.

According to the seventh embodiment, BGA bumps or through hole terminals may be employed in place of the pins. In addition, the material of the scintillators may be CsI, NaI or LSO instead of $CdWO_4$ or scintillators of various ceramics may be used, as well.

Figure 16:
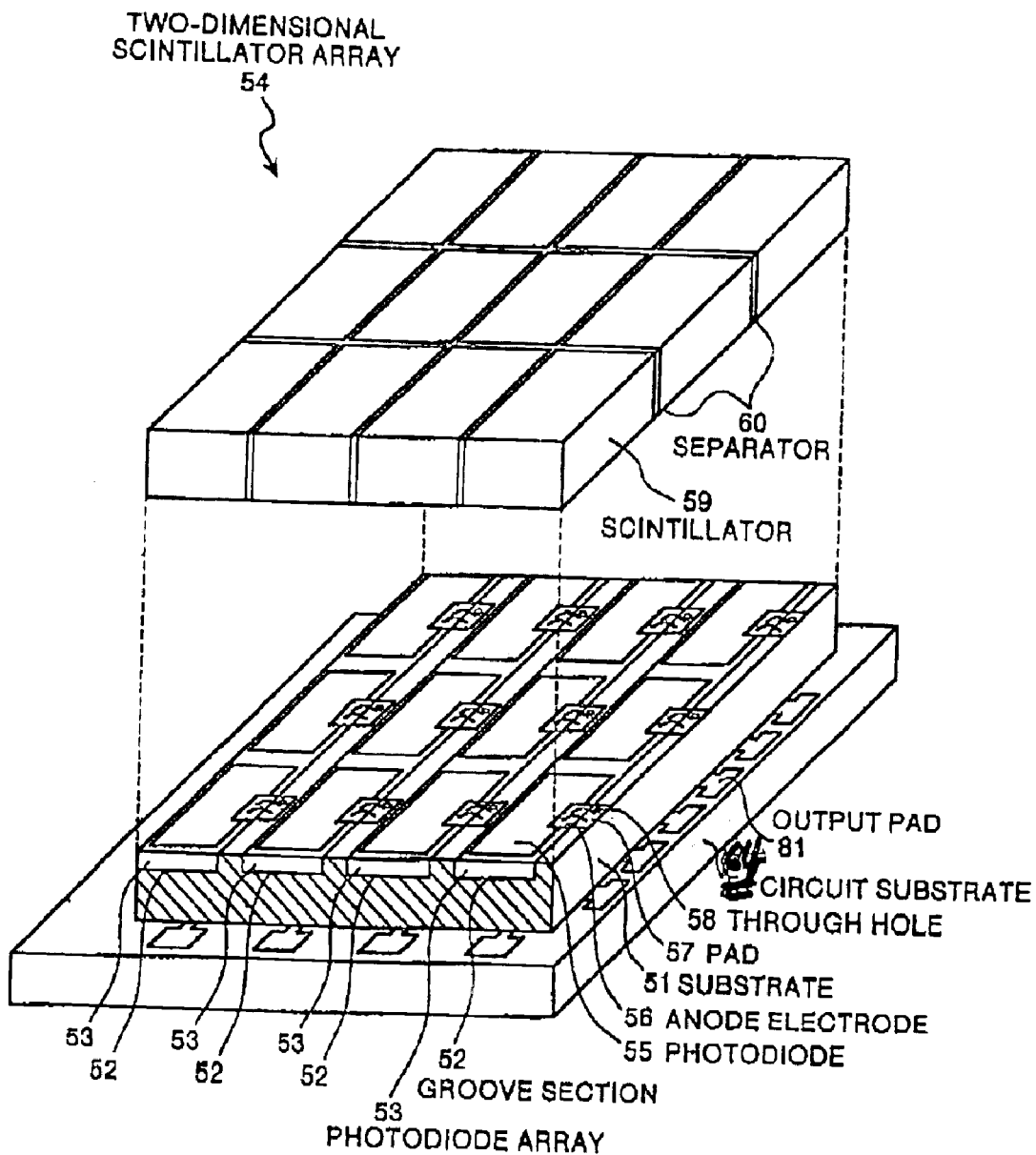
FIG. 16 is a schematic perspective view of a radiation detection apparatus in the seventh embodiment in a state in which a two-dimensional scintillator array is separated.

A component of a radiation detector in a seventh embodiment will be explained now. FIG. 16 is a schematic perspective view of a radiation detection apparatus in the seven the embodiment. As shown in FIG. 16, the component of a radiation detector in the seventh embodiment includes a substrate 51 which has a groove section 52 extended in a slice direction and a photodiode array 53 which is embedded into the groove section 52. A two-dimensional scintillator array 54 is arranged on the substrate 51 and the photodiode array 53 embedded into the groove section 52 of the substrate 51. In FIG. 16, the two-dimensional scintillator array 54 is arranged to be spatially separated from the substrate 51. This is intended to facilitate understanding the structure of the radiation detection apparatus in the seventh embodiment. Actually, however, the two-dimensional scintillator array 54 is fixedly attached to the substrate 51 by transparent adhesive. In addition, a circuit board 64 is arranged under the substrate 51. An electrical circuit mounted on the circuit board 64 is electrically conductive to individual photodiodes 55 which constitute the photodiode arrays 53.

The photodiode array 53 has a plurality of photodiodes 55 which are arranged in a one-dimensional array on the photodiode array 53. In the seventh embodiment, the photodiode array 53 is arranged so that the large length direction of the array 53 is the slice direction. The radiation detection apparatus has, therefore, a structure in which four photodiodes 55 are arranged in a channel direction (at right angle to the slice direction) and three photodiodes 55 are arranged in the slice direction.

The two-dimensional scintillator array 54 has a plurality of scintillators 59 and separators 60. A plurality of scintillators 59 are arranged two-dimensionally to correspond to the photodiodes 55, respectively. The separators 60 are put between the scintillators 59, respectively.

Each of the scintillators 59 converts an incident X-ray into a visible light beam. The scintillator 59 is made of $CdWO_4$, CsI, NaI or the like and functions to output a visible light beam in accordance with the intensity of the incident X-ray to the corresponding photodiode 55. In addition, a white paint is applied to the outer surface of, each scintillator 59 so as to prevent the visible light beam converted from the X-ray within the scintillator 59 from leaking to the outside of the scintillator 59. The material of the scintillator 59 may be other than that mentioned above. Typically, $Bi_4Ge_3O_{12}$, $BaF_2$, $Gd_2SiO_5$, $Lu_2SiO_5$ or various ceramics are available. Basically, any material which can convert an incident radiation ray into a light beam is available.

The separators 60 prevent the transmission of X-rays and visible light beams. Each separator 60 contains lead (Pb) and the like and functions to reflect or absorb an X-ray and a visible light beam. By putting the separators 60 between the scintillators 59, respectively, it is possible to prevent cross talk from being occurring if X-rays are diagonally incident on the surfaces of the scintillators 59 and the same X-ray is incident on a plurality of scintillators 59. This is true for visible light beams converted from X-rays. Namely, by arranging the separators 60, it is possible to prevent optical cross talk from being occurring if a visible light beam generated in a certain scintillator 59 is incident on the other scintillator(s) adjacent the certain scintillator 59.

Each photodiode 55 receives the visible light beam converted from the X-ray within the corresponding scintillator 59, converts the received visible light beam into an electrical signal and outputs the electrical signal to the outside. The photodiode 55 consists of a PIN type photodiode which has an n-type layer on a bottom section and which has a p-type layer formed on the surface section of the photodiode array 53. Further, the photodiode 55 has an anode electrode 56 connected to the p-type layer on an upper peripheral edge section and a cathode electrode in contact with the n-type layer on a bottom section.

Figure 17:
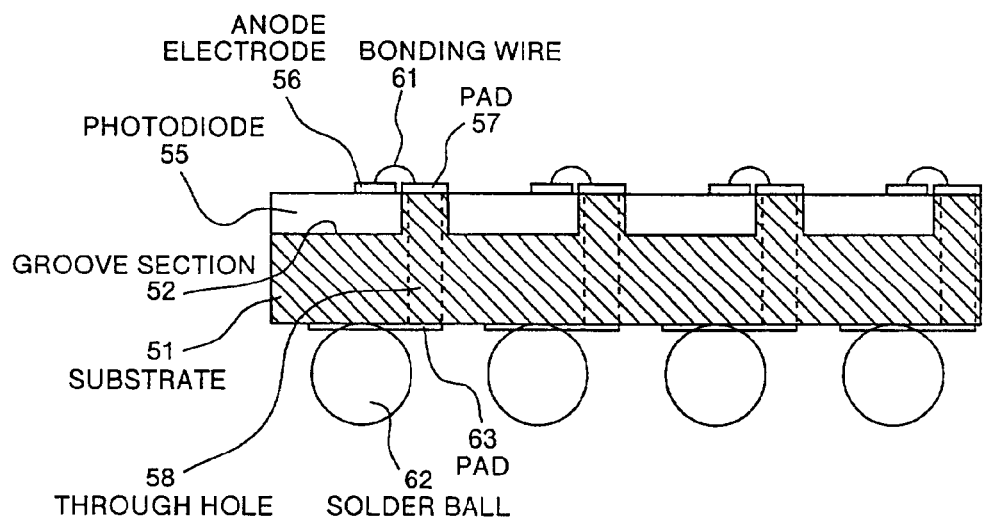
FIG. 17 is a schematic cross-sectional view which shows the schematic of electrical connection in the radiation detection apparatus in a seventh embodiment.

The manner in which the photodiodes 55 and the circuit board 64 are electrically connected will be explained with reference to FIG. 17. FIG. 17 shows a part of the cross-sectional structure of the radiation detection apparatus in the seventh embodiment. In FIG. 17, the two-dimensional scintillator array 54 and the circuit board 64 are not shown to facilitate understanding.

As shown in FIGS. 16 and 17, the photodiodes 55 are embedded into the groove section 52 provided in the substrate 51. As is obvious from FIG. 17, the groove section 52 has an equal depth to the thickness of each photodiode 55. For that reason, the anode electrode 56 arranged on the upper surface of each photodiode 55 and each pad 57 arranged on the upper surface of the substrate 51 form the same plane in a state in which the photodiodes 55 are embedded into the groove section 52. In addition, the anode electrode 56 arranged on the upper surface of each photodiode 55 is connected to each pad 57 arranged on the upper surface of the substrate 51 by a bonding wire 61. Further, in each broken-line region in FIG. 17, a through hole 58 is provided and the through hole 58 is electrically connected to the pad 57.

Furthermore, the through hole 58 penetrates through the rear surface of the substrate 51 and is electrically connected to each pad 63 arranged on the rear surface of the substrate 51. Therefore, an electrical signal output from the anode electrode 56 is transmitted to the pad 63 arranged on the rear surface of the substrate 51 through bonding wire 61, the pad 57 and the through hole 58. As shown in FIG. 16, the circuit board 64 is arranged on the rear surface of the substrate 51. Each pad 63 is electrically connected to the electrical circuit provided on the circuit board 64. A solder ball 62 is arranged under the pad 63, so that the pad 63 is electrically connected to the electrical circuit provided on the circuit board 64 by the solder ball 62. Specifically, heat is applied while the substrate 51 is tentatively fixed onto the circuit board 64 to melt the solder ball 62, thereby ensuring the pad 63 conductive to the electrical circuit. By providing the structure explained above, the radiation detection apparatus in the seventh embodiment can output an electrical signal from each photodiode 55 to the outside of the apparatus from the corresponding pad 63 on the circuit board 64.

Figure 18:
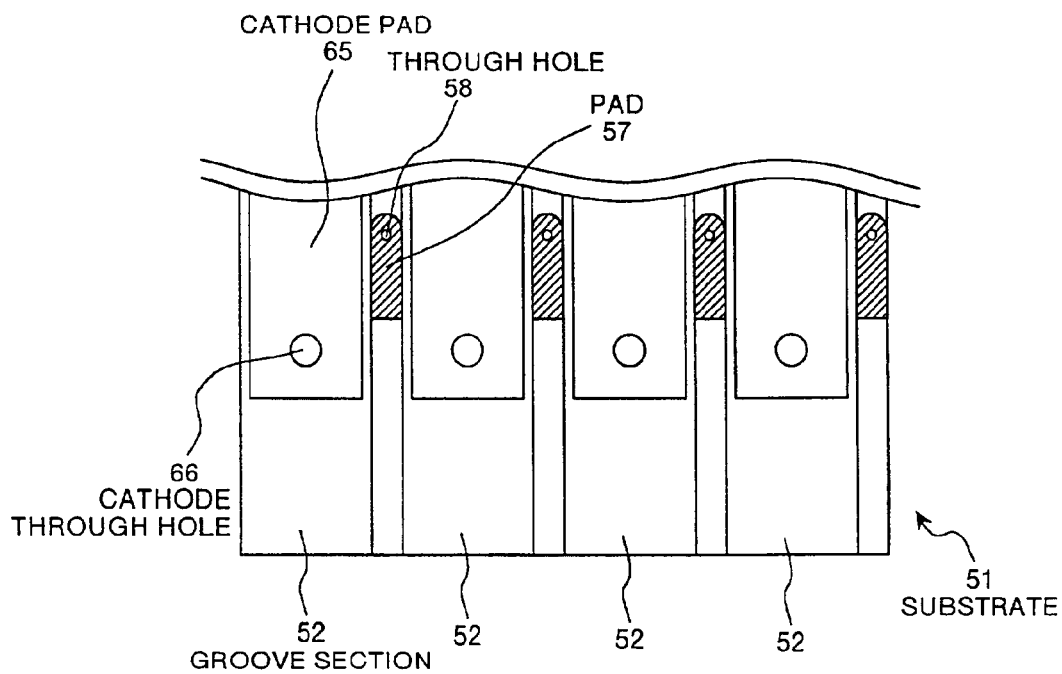
FIG. 18 is a schematic top view which shows the structure of a substrate in the radiation detection apparatus in the seventh embodiment.

The manner of holding the cathode electrode provided on the rear surface of each photodiode 55 conductive to the circuit board 64 will be explained now. FIG. 18 is a top view which shows the end section of the substrate 51 which constitutes the radiation detection apparatus 51 in the seventh embodiment. It is noted that FIG. 18 shows a state before the photodiode array 53 is embedded into the groove section 52.

Cathode pads 65 are arranged on the bottom of the grove section 52 provided in the substrate 51. The cathode pads 65 are arranged on the entire bottom of the groove section 52 so as to electrically connect the cathode electrodes provided on the bottoms of the photodiodes 55 arranged on the photodiode array 53, respectively. Therefore, the individual photodiodes 55 are short-circuited in respect of the cathode electrodes. However, since the anode electrodes are separated for the respective photodiodes 55, electrical signals are not synthesized at the time of outputting the electrical signals.

In addition, a cathode through hole 66 is arranged on a partial region of each cathode pad 65. The cathode through hole 66 is provided to electrically connect the bottom of the groove section 52 to the rear surface of the substrate 51. As in the instance of the connection between the anode electrode and the electrical circuit on the circuit substrate 64 shown in FIG. 17, the cathode through hole 66 is electrically connected to each pad 63 provided on the rear surface of the substrate 51. Further, each pad 63 provided on the rear surface of the substrate 51 is connected to the electrical circuit on the circuit board 64 through the solder ball 62. As a result, the radiation detection apparatus in the seventh embodiment has a structure in which an electrical signal output from each photodiode 55 is output to the outside of the apparatus.

Figure 19:
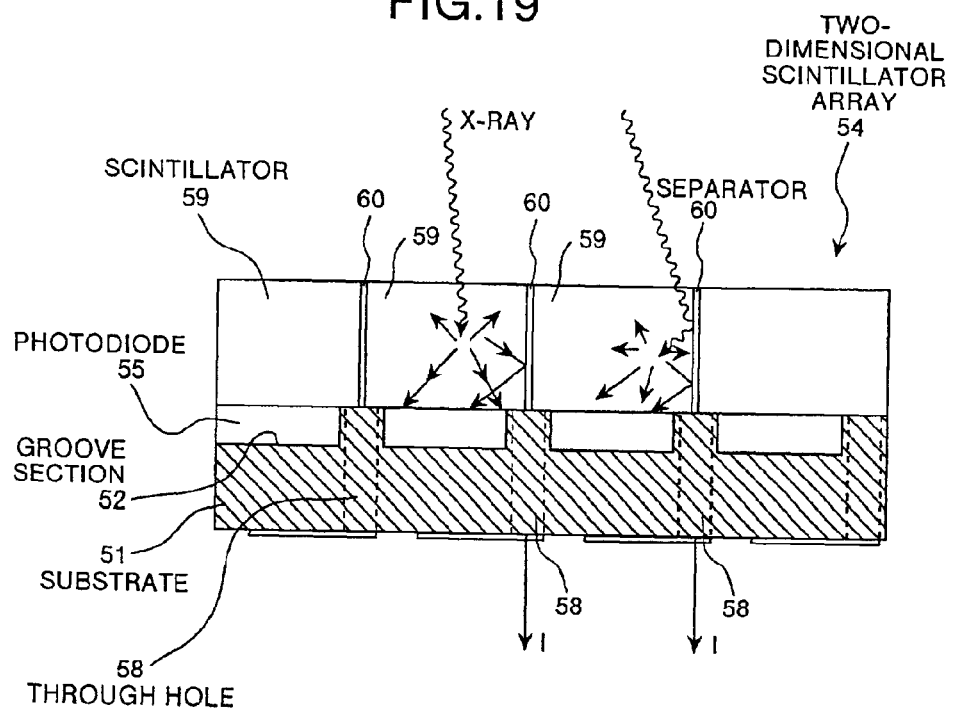
FIG. 19 is a schematic cross-sectional view which shows the operation of the radiation detection apparatus in the seventh embodiment.

The operation of the radiation detection apparatus in the seventh embodiment will be explained now. FIG. 19 is a typical view which shows a manner in which X-rays are incident on the radiation detection apparatus in the seventh embodiment.

An X-ray incident on the upper surface of each scintillator 59 is converted into a visible light beam within the scintillator 59. Efficiency of converting the X-ray into the visible light beam is proportional to the energy of the X-ray. The X-rays incident on the upper surfaces of the scintillators 59 at angles other than the right angle are all converted into visible light beams before reaching the side surfaces of the scintillators 59 or, even if reaching the side surfaces thereof as the X-rays, most of the X-rays are absorbed or reflected by the separators 60. The X-rays are hardly incident on the adjacent other scintillators 59. The same thing is true for the visible light beams converted from the X-rays, i.e., the visible light beams are not incident on the other scintillators 59.

The visible light beam converted from the X-ray is incident on the photodiode 55. The photodiode 55 converts the received visible light beam into an electrical signal. Specifically, an electrical signal is generated based on the generation of a pair of an electron and a hole in the photodiode 55 by the incident light. The intensity of the electrical signal is proportional to energy held by the visible light beam received by the photodiode 55. As already explained above, since the energy of the visible light beam is proportional to the intensity of the X-ray incident on each scintillator 59, the intensity of the electrical signal output from the photodiode 55 is obviously proportional to the intensity of the X-ray incident on the corresponding scintillator 59. The electrical signal output from each photodiode 55 is transmitted to the rear surface of the substrate 51 through the through hole 58 and the cathode through hole 66 and output to the outside through the circuit board 64. While FIG. 19 shows a manner in which currents I are output as an example of the electrical signals, the electrical signals are not limited thereto but may be output in the form of voltage changes.

As explained so far, by providing the structure in which the electrical signal in accordance with the intensity of the X-ray incident on each scintillator 59 is output, the radiation detection apparatus in the seventh embodiment can obtain an X-ray intensity distribution in relation to incident positions.

The radiation detection apparatus in the seventh embodiment has a structure in which a plurality of photodiode arrays 53 on which the photodiodes 55 are arranged in columns, are arranged. The radiation detection apparatus in the seventh embodiment has an advantage of improving product yield. In other words, if a plurality of two-dimensional photodiode arrays shown in FIG. 16 are formed on the same substrate and only one defective photodiode exists among the twelve photodiodes, then the remaining eleven photodiodes cannot be used for the radiation detection apparatus.

On the other hand, according to the radiation detection apparatus in the seventh embodiment, even if one photodiode 55 is defective, it suffices to replace the photodiode array 53 including the defective photodiode 55 by another one and the remaining nine photodiodes can be, therefore, effectively utilized. As for the radiation detection apparatuses employed in recent X-ray CT scan systems, in particular, the number of channels increases and the number of slices increases. The number of photodiodes arranged tends to increase, accordingly. Therefore, it can be expected that the radiation detection apparatus in the seventh embodiment in which a plurality of one-dimensional photodiode arrays 53 are arranged exhibits further improved yield.

In addition, the radiation detection apparatus in the seventh embodiment adopts a structure in which the photodiode arrays 53 each having one-dimensional photodiodes arranged one-dimensionally are embedded into the groove section 52. By doing so, the following advantages can be obtained. Since the width of the groove section 52 is equal to the width of each photodiode array 53, it is easy to position the photodiode arrays 53 relative to the groove section 52. As a result, to arrange the photodiode arrays 53 on the substrate 51, it suffices to position the photodiode arrays 53 only in respect of the slice direction. Besides, if a protrusion or a groove section is additionally provided for the positioning in the slice direction, the photodiode arrays 53 can be easily arranged without the need to execute a step such as a position adjustment step. Consequently, the radiation detection apparatus in the seventh embodiment can be manufacture easily and swiftly.

Moreover, according to the seventh embodiment, the thickness of each photodiode array 53 is almost equal to the depth of the groove section 52. As a result, the radiation detection apparatus in this embodiment has an advantage in that a region necessary for the bonding wires 61 can be made small.

To output the electrical signals from the respective photodiodes 55 arranged on each photodiode array 53 to the outside of the apparatus, it is necessary to electrically connect the anode electrode 56 and the cathode electrode of each photodiode 55 to each electrode provided on the substrate. If the photodiode arrays are arranged on a flat plate, there is no avoiding generating a difference in height between each anode electrode and each pad arranged on the substrate. If such a difference in height exists, it is necessary to set the horizontal distance necessary for a wire bonding to be large. In the seventh embodiment, by contrast, no difference in height is generated between each anode electrode 56 and the corresponding pad 57 at all or even if the difference in height is generated, it is quite a slight difference, so that it is not necessary to secure a large horizontal distance as seen in the conventional art.

Moreover, in the seventh embodiment, the radiation detection apparatus has a structure in which the anode electrodes 56 are pulled out arranged on the upper surface of the photodiodes 55 by using the through hole 58. Therefore, the width of the bank section of the substrate 51 located between the adjacent photodiode arrays 53 can be narrowed. Conventionally, since necessary wirings are provided on the upper-surface of the substrate, it is necessary to narrow the width of wirings or widen a distance between the photodiode arrays 53.

Moreover, in the seventh embodiment, the structure of pulling out the anode electrodes 56 three-dimensionally is adopted and there is no need to provide wirings on the upper surfaces of the substrates 51. Therefore, even if the radiation detection apparatus has a structure in which the number of photodiodes 55 increases as the number of channels and that of slices increase, it is unnecessary to secure a wide distance between the photodiode array 53, making it possible to maintain a fixed distance therebetween. Specifically, the width of the bank section of the substrate 51 located between the photodiode arrays 53 can be arbitrarily narrowed as long as the width necessary for the bonding wire and the through hole can be secured. It is, therefore, possible to set an area occupied by the photodiodes 55 wide on the surface of the radiation detection apparatus perpendicular to the incident direction of the X-rays and to there by realize a radiation detection apparatus having high sensitivity.

Furthermore, in the seventh embodiment, the radiation detection apparatus has a structure in which electrical signals are output to the outside of the apparatus by the electrical circuit on the circuit substrate 64 if the anode electrode 56 is pulled out from each substrate 51 in the perpendicular direction thereof and connected to the circuit substrate 64. In this instance, it is possible to constitute a circuit even in a region of the circuit substrate 64 located below the photodiode arrays 53, an area used for the circuit can be advantageously made large compared with an instance in which an electrical circuit is arranged on each substrate 51. As a result, it is unnecessary to provide microscopic wirings and it is thereby possible to avoid the risk of increasing resistance and breaking wirings.

Additionally, in the seventh embodiment, the groove section 52 can be easily provided on the substrates 51. For example, if the surface of each substrate 51 is scraped using a dicing saw which is employed to isolate semiconductor chips, the groove section 52 can be formed. The seventh embodiment has, therefore, an advantage in that the radiation detection apparatus can be easily manufactured. Besides, since the photodiode arrays 53 can be positioned with a simple structure, the radiation detection apparatus can be easily manufactured in this respect, as well.

In addition, in the seventh embodiment, the pad 63 provided on the rear surface of each substrate 51 is electrically connected to the circuit board 64 through the solder ball 62. It is, therefore, possible to easily fix the substrate 51 to the circuit board 64 and to thereby easily manufacture the radiation detection apparatus.

While the structure in which there are three slices and four channels are provided per slice is adopted in the seventh embodiment, a structure in which a plurality of photodiodes are employed per channel of a predetermined slice in the slice direction may be adopted.

While the large length direction of the photodiode arrays 53 is the slice direction and the small length direction thereof is the channel direction in the seventh embodiment, these directions may be reversed. That is, it is possible to constitute the radiation detection apparatus in the seventh embodiment even if the photodiode arrays 53 are arranged so that the large length direction thereof is parallel to the channel direction.

Furthermore, while the bonding wire 61 connecting each anode electrode 56 to each pad 57 is arched in FIGS. 16 and 17, the linear bonding wire 61 may be employed. As explained above, there is no difference in height between the upper surface of the substrate 51 and that of the photodiode 55. For that reason, even if the anode electrode 56 is connected to the pad 57 by the linear bonding wire, there is no fear of the breaking of the bonding wire or the like.

Moreover, the horizontal sectional shape of each through hole 58 and each cathode through hole 66 is not necessarily circular. If the horizontal section shape thereof is a shape of an ellipse which has a long axis in the large length direction of the photodiode arrays 53, the length of the outer periphery of the ellipse can be set large. Compared with a circular shape, it is possible to effectively suppress electrical resistance generated when an electrical signal passes through each through hole.

In the seventh embodiment, the structure in which the PIN type photodiodes are arranged so that the p-type layer of each photodiode is put on the upper surface of the photodiode and the anode electrode 56 is exposed to the upper surface of the photodiode, is adopted. Alternatively, a structure in which the n-type layer is arranged on the upper surface of the photodiode and the cathode electrode is exposed to the upper surface thereof may be adopted. Even with the latter structure, the radiation detection apparatus can obtain the same advantage.

While the PIN type photodiodes are used as the photodiodes 55 included in each photodiode array 53 in the seventh embodiment, the photodiodes are not limited thereto but PN junction photodiodes, Schottky photodiodes, heterojunction photodiodes or avalanche photodiodes may be employed instead of the PIN photodiodes. Alternatively, circuits other than the photodiodes may be used as long as they can perform photoelectric conversion. For example, photo resistors each having an electrical resistance changing according to the intensity of light applied thereto may be employed in place of the photodiodes.

Furthermore, while the circuit board 64 is arranged under the substrate 51 in the seventh embodiment, the circuit substrate 64 can be omitted. For example, a circuit pattern may be formed on the rear surface of each substrate 51 in advance and a pad used to output an electrical signal to the outside of the apparatus may be arranged on the side surface of the substrate 51. In this instance, it is possible to dispense with the circuit substrate 64 and the solder balls 62.

Figure 20:
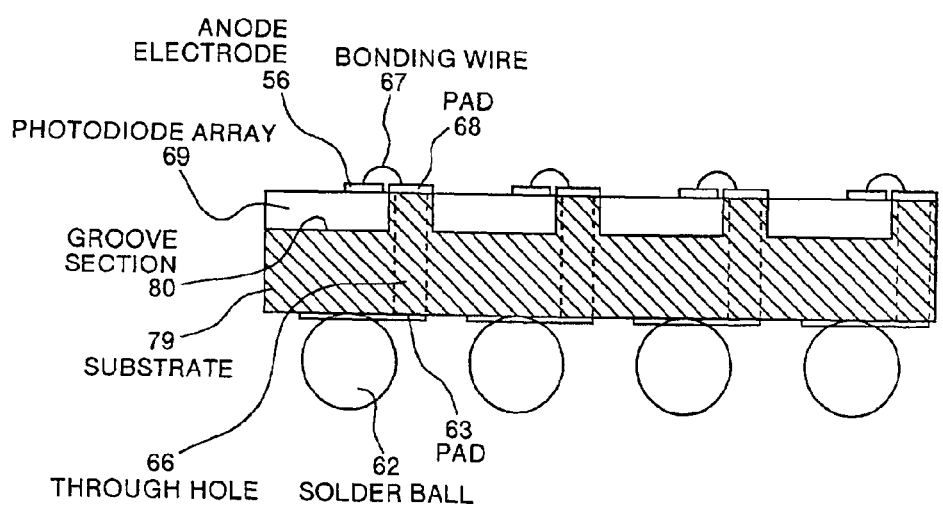
FIG. 20 is a schematic cross-sectional view which shows the structure of a radiation detection apparatus in a eighth embodiment.

A radiation detection apparatus in an eighth embodiment will be explained now. FIG. 20 is a schematic cross-sectional view which shows the structure of the radiation detection apparatus in the eighth embodiment. In FIG. 20, two-dimensional scintillator arrays arranged on substrates 79 and a circuit board arranged under the substrate 79 are not shown to facilitate understanding.

In the radiation detection apparatus in the eighth embodiment, a groove section 80 which is provided on the upper surface of the substrate 79 is formed to be deeper than that in the seventh embodiment. The remaining respects are the same in structure as those in the seventh embodiment and exhibit the same advantages as those of the seventh embodiment unless otherwise specified.

In the eighth embodiment, the depth of the groove section 80 is set larger than the thickness of a photodiode array 69 embedded into the groove section 80. As a result, the following advantages are obtained.

Since photodiode arrays 69 which are manufactured on the same conditions are embedded into the groove section 80, it is normally assumed that the difference in thickness does not occur among the photodiode arrays 69. Actually, however, the photodiode arrays 69 sometimes differ in thickness. If photodiodes are formed by epitaxial growth on a semiconductor substrate, in particular, it is difficult to perfectly perform epitaxial growth, with the result that the difference in thickness often occurs.

If the photodiodes 69 differ in thickness, an upper surface formed by the substrates 79 and the photodiode arrays 69 embedded into the groove section 80 cannot be made smoothly flat. If two-dimensional scintillator arrays are arranged on such an upper surface, there is a probability of deteriorating the stability of the two-dimensional scintillator arrays. To prevent this, it is possible to provide a structure in which gaps generated between the substrates 79 and the two-dimensional scintillator arrays are filled with transparent adhesive layers, respectively. In that instance, however, optical cross talk caused by the leakage of light from the gap sections filled with the transparent adhesive layers disadvantageously occurs.

In the eighth embodiment, therefore, the depth of the groove section 80 is set larger than the thickness of each photodiode array 69. In addition, the upper surface of the substrate 79 is fixedly attached to the two-dimensional scintillator array through transparent adhesive. It is noted that the upper surface of each photodiode array 69 does not contact with the two-dimensional scintillator array. Since the upper surfaces of the substrates 79 form the same flat surface except for the groove section 80, it is possible to advantageously solve the problem that the flat surface cannot be formed. In addition, since no gaps are generated between the upper surfaces of the substrates 79 and the two-dimensional scintillator arrays, it is also possible to avoid the problem of optical cross talk.

It is preferable that the distance between the depth of the groove section 80 and the thickness of each photodiode array 69 is not less than 1 $\mu$m and not more than 100 $\mu$m. The reason of setting the difference to be not less than 1 $\mu$m is as follows. If the difference is too small, the difference in thickness among the individual photodiode arrays 69 cannot be absorbed. The reason of setting the difference to be not more than 100 $\mu$m is as follows. If the difference is larger than 100 $\mu$m, the difference in height between the anode electrode 56 of each photodiodes included in the photodiode array 69 and each pad 68 arranged on the upper surface of the substrate 79 cannot be ignored, with the result that it is necessary to set the distance between the photodiode arrays 69 wide for wire bonding by the boding wires 67.

Figure 21:
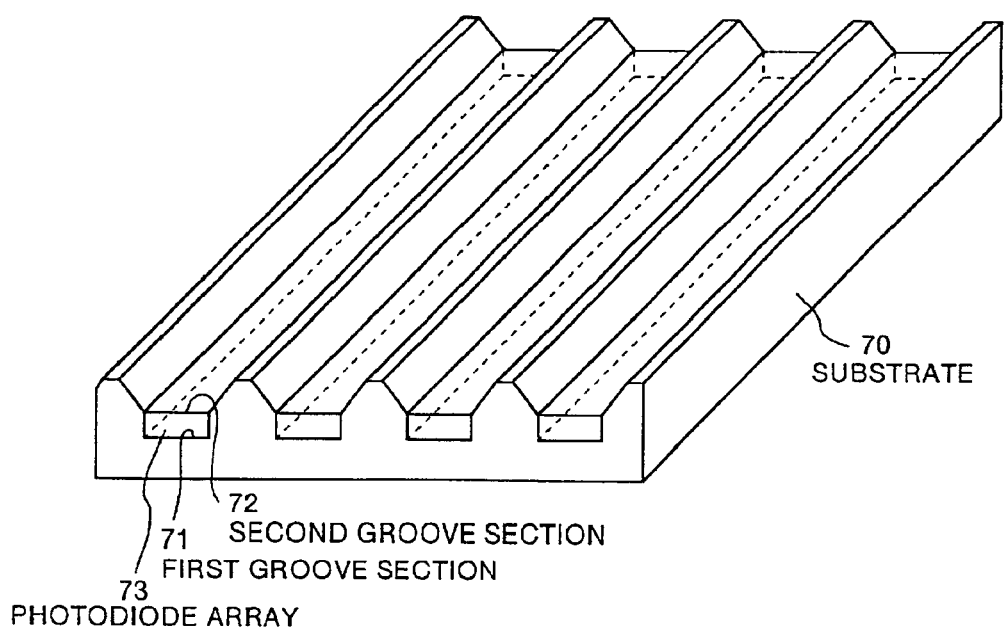
FIG. 21 is a schematic perspective view which shows the structure of a radiation detection apparatus in a ninth embodiment.

A ninth embodiment will be explained now. FIG. 21 is a schematic perspective view which shows a substrate 70 and photodiode arrays 73 embedded into the substrate 70 which constitute a radiation detection apparatus in the ninth embodiment. In the radiation detection apparatus in the ninth embodiment, the second groove section 72 is provided on the upper section of the first groove section 71 which is provided to embed the photodiode arrays 73 into the substrate 70. As shown in FIG. 21, the second groove section 72 has a structure in which an opening section wide in a channel direction is formed in the upper section thereof and a width thereof is narrower in a light receiving downstream direction. Since the first groove section 71 is formed to embed the photodiode arrays 73 into the substrate 70, the cross section of the first groove section 71 is rectangular. It is noted that the respects which will not be explained in this embodiment are the same as those of the radiation detection apparatus in the seventh embodiment and equal in function. For example, in the ninth embodiment, a circuit board is arranged under the substrate 70, and the circuit board is electrically connected to each pad 63 provided on the rear surface of the substrate through a solder ball 62 so that an electrical signal is output to the outside of the apparatus.

Figure 22:
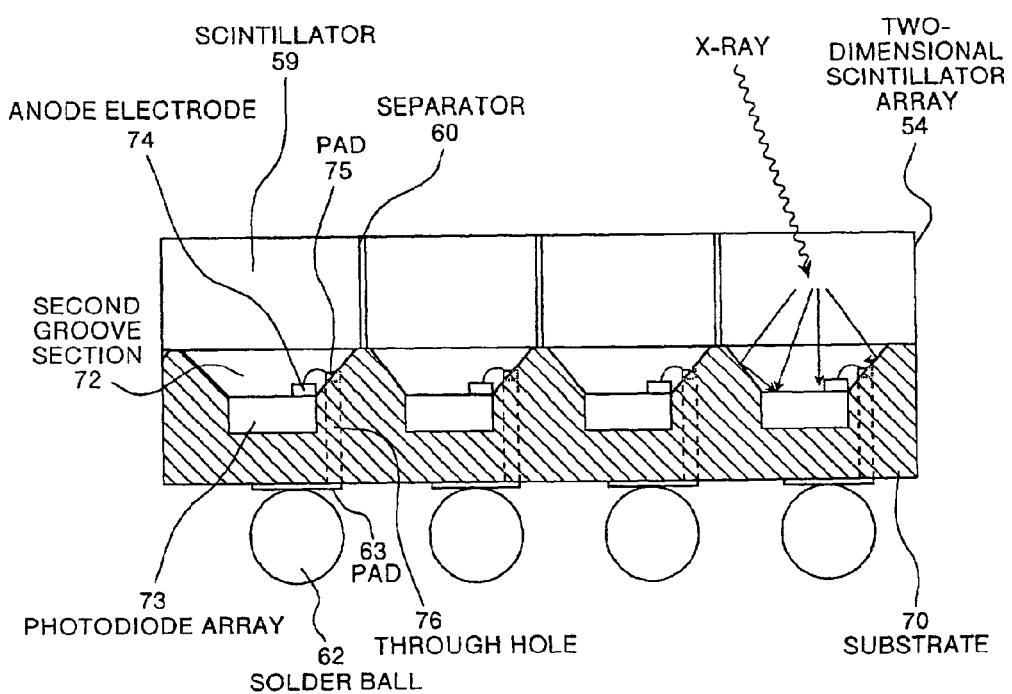
FIG. 22 is a schematic cross-sectional view which shows the operation of the radiation detection apparatus in the ninth embodiment.

FIG. 22 is a schematic cross-sectional view which shows the structure of the radiation detection apparatus in the ninth embodiment. The photodiode arrays 73 are embedded into the first groove section 71 formed in the substrate 70. An anode electrode 74 of each of photodiodes arranged on each photodiode array 73, is electrically connected to a pad 75 provided on an inclined surface constituting the second groove section 72 through a bonding wire. In addition, a through hole 76 which penetrates from the second groove section 72 to the substrate 70 in a vertical direction is arranged for each photodiode and electrically connected to the pad 75. Further, pads 63 are provided on the rear surfaces of the substrates 70 and electrically connected to the through holes 76, respectively. An electrical signal which is output from each photodiode arranged on each photodiode array 73 is, therefore, output to the rear surface of the substrate 70 through the pad 75, the through hole 76 and the pad 63.

The second groove section 72 functions as a waveguide path which collects visible light beams converted from x-rays in respective scintillators 59 to the photodiode arrays 73. That is, by providing the second groove section 72, the visible light beam converted from the X-ray in each scintillator 59 is appropriately reflected on the inclined surface which constitutes the second groove section 72, reaches the corresponding photodiode included in the photodiode array 73 and is received by the photodiode. To improve the visible light beam reflectance of the second groove section 72 or to efficiently irradiate visible light beams into the photodiodes, a multilayer structure which consists of a plurality of films having different refraction indexes may be provided in the second groove section 72.

An advantage of providing the second groove section 72 will be explained. The radiation detection apparatus in the ninth embodiment has a structure of collecting visible light beams by the second groove section 72. Compared with an X-ray receiving area on the upper surface of each scintillator 59, the area of the light receiving section of each photodiode can be made small. As a result, it is possible to make the photodiodes which constitute the radiation detection apparatus small in size and to thereby reduce manufacturing cost. This is because each photodiode is made small in size and the number of photodiodes which can be manufactured from a single wafer can thereby increase.

Figure 23:
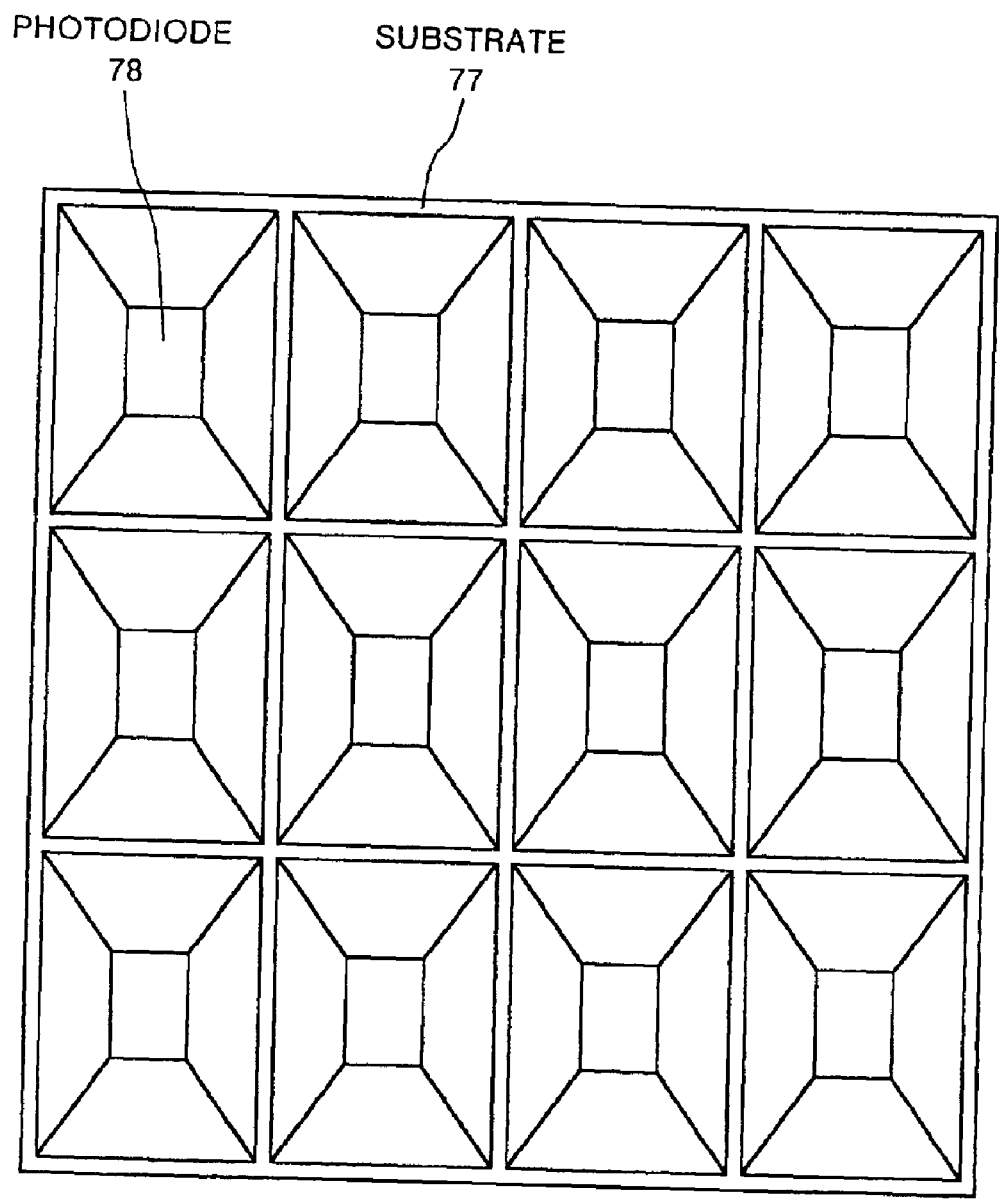
FIG. 23 is a schematic top view which shows the structure of a radiation detection apparatus in a modification of the ninth embodiment.
Figure 24A:
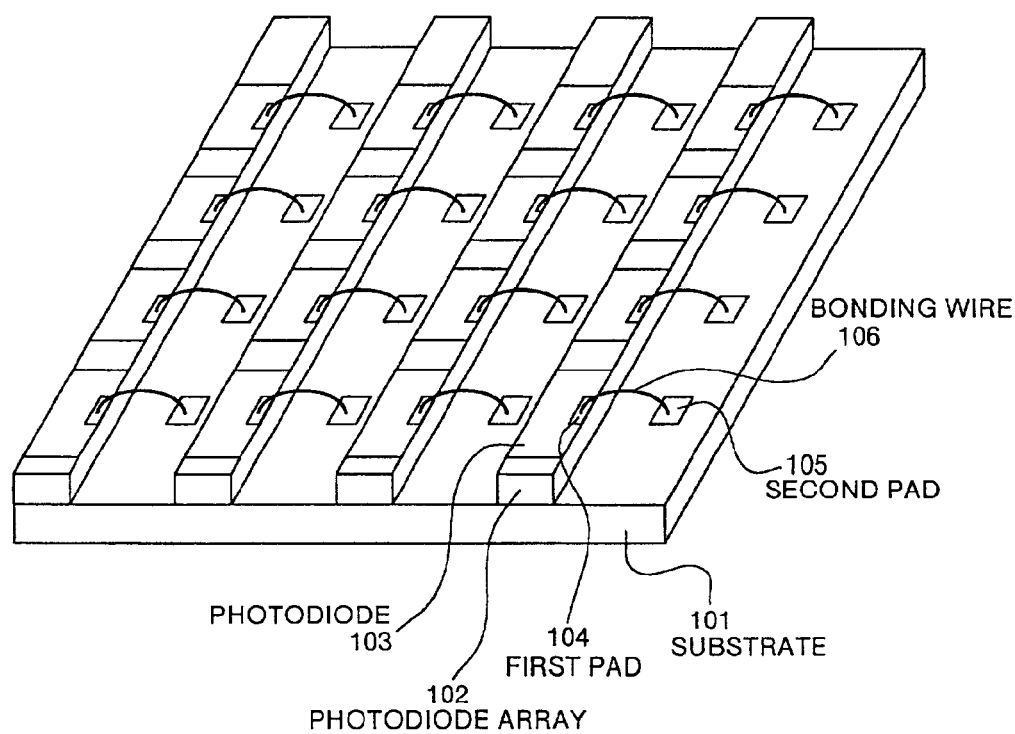
FIG. 24A is a schematic perspective view which shows the structure of a radiation detection apparatus according to conventional art.
Figure 24B:
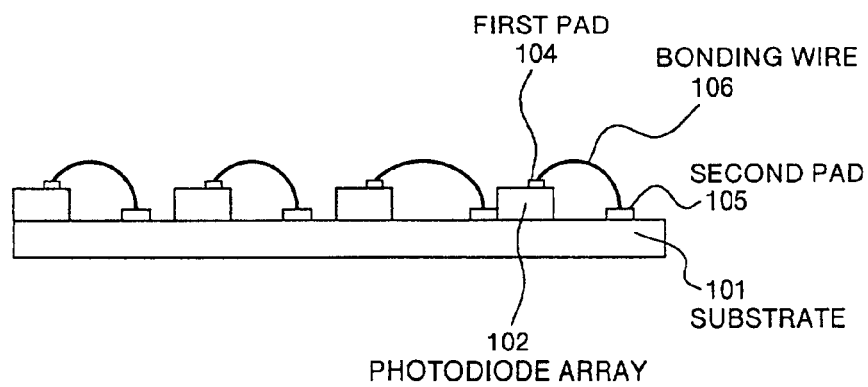
FIG. 24B is a schematic cross-sectional view which shows the manner of the electrical connection of the radiation detection apparatus according to the conventional art.

A modification of the radiation detection apparatus in the ninth embodiment will be explained now. FIG. 23 is a schematic top view which shows a substrate 77 and photodiodes 78 arranged on the substrate 77 which constitute the radiation detection apparatus in the modification. This modification is the same as the ninth embodiment in that two-dimensional scintillator array is arranged on the substrate 77 and a circuit board is arranged under the substrate 77. In the modification, not the photodiode array but individually separated photodiodes 78 are arranged on the substrate 77. The photodiodes 78 are embedded into the first groove section which is provided in the substrate 77 as in the instance of the ninth embodiment. In addition, the second groove section which functions as a waveguide path is formed on the upper section of the first grove section into which the photodiodes 78 are embedded.

In the modification, the second groove section has inclined surfaces not only in a slice direction but also in a channel direction and functions as a waveguide path which converges incident visible light beams on the photodiodes 78. It is, therefore, possible to further efficiently collect the visible light beams in the photodiodes 78 and to thereby make each photodiode 78 further smaller in size.

The present invention has been explained so far while referring to the first to ninth embodiments thereof. The present invention is not limited to these embodiments and those skilled in the art could contrive various modifications from these embodiments. For example, in the first to third embodiments and the seventh to ninth embodiments, a photo-detector can be obtained by excluding the scintillators or the scintillator arrays. According to the present invention, it is possible to increase an area occupied by the photodiodes. Therefore, by applying the structure of the present invention to the photo-detector, it is possible to provide a photo-detector having a large light receiving area and high sensitivity.

In the first to ninth embodiments, the pad provided on the upper surface of each photodiode is electrically connected to the substrate by the bonding wire. However, the electrical connection between the pad and the substrate is not limited to the wire bonding. For example, the electrical connection may be established by means of a flip-chip method or a TAB (Tape Automated Bonding) method. In the first to ninth embodiments, the pad provided on the upper surface of each photodiode and the substrate form the same plane, so that they can be easily electrically connected by these methods.

Further, in the seventh to ninth embodiments, each photodiode converts a visible light beam into an electrical signal. Alternatively, a light beam having a wavelength other than that of the visible light may be applied to the photodiode. Specifically, by employing Schottky photodiodes, it is possible to convert light beams in a shorter wavelength band than a visible light range into electrical signals. If photodiodes are formed out of InSb, for example, it is possible to obtain a photoelectric element having sensitivity up to an infrared range by decreasing the temperature of the photodiodes to nitrogen temperature. If such photodiodes are combined with scintillators each of which converts an X-ray into a light beam having the wavelength band explained above, it is possible to constitute the component of a radiation detector, the radiation detector and the radiation detection apparatus.

Moreover, in the seventh to ninth embodiments, one photodiode array is embedded into one groove section. Alternatively, a plurality of photodiode arrays aligned in a slice direction may be embedded into one groove section. Alternatively, not one photodiode array but individual photodiodes may be embedded into one groove section. In that instance, it is preferable that a protrusion or a groove which positions the individual photodiodes is provided in the groove section.

According to the component of a radiation detector and the radiation detector of the present invention, the MID substrate is employed, the difference in height between the upper surface of each photodiode and the surface of the primary substrate is eliminated to thereby minimize space necessary for a wire bonding, the output terminals are arranged below the primary substrate and the output terminals are connected to the wiring bonding pads by three-dimensional wirings, respectively to thereby make the radiation detector small in size. It is, therefore, possible to arrange the radiation detectors without gaps formed therebetween. Consequently, it is possible to maximize the effective X-ray receiving area of, for example, the X-ray CT system per unit area and to improve the detection efficiency thereof.

In addition, according to the component of a radiation detector and the radiation detector of the present invention, each wiring electrically connected to each photodiode of the photodiode array is pulled out from the downstream side of the radiation detector in the light receiving direction, i.e., from the lower side thereof. It is, therefore, easy to make a unit radiation detector small in size and to manufacture the unit radiation detector. Consequently, it is possible to arrange the radiation detectors without gaps formed therebetween, to maximize the effective X-ray receiving area of, for example, the X-ray CT system per unit area and to improve the detection efficiency thereof.

Moreover, according to the radiation detection apparatus of the present invention, the groove section is formed in the upper surface of the substrate and the photodiode array is embedded into the groove section, thereby making it possible to easily position the photodiode array. Further, the first pads arranged on the photodiode array and the second pads arranged on the substrate are arranged to constitute the same plane. It is, therefore, possible to minimize space necessary for a wire bonding, to maximize the effective X-ray receiving area of, for example, the X-ray CT system per unit area and to improve the detection efficiency thereof. Besides, since each second pad is electrically connected to each third pad provided on the rear surface of the substrate by the three-dimensional wiring such as a through hole and an electrical signal is output from the third pad. It is, therefore, possible to maximize the effective X-ray receiving area and to secure a wide region for wirings.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A component of a radiation detector comprising:
   an embedding groove section provided on a part of a non-metallic substrate;
   a photoelectric element array, which includes a plurality of photoelectric elements for receiving light that are arranged in a one-dimensional array, and which is embedded into the embedding groove section;
   a first pad arranged on each of light receiving surfaces of the photoelectric elements; and
   a second pad provided on the substrate to correspond to the first pad, and electrically connected to the first pad.

2. The component according to claim 1, further comprising
   an optical waveguide path provided upstream from the photoelectric element array in a light receiving direction, and
   a light receiving section provided on an upper surface of the substrate, wherein
   the optical waveguide path guides light coming to the light receiving section to the light receiving surfaces of the photoelectric elements.

3. The component according to claim 2, wherein
   the light receiving surface of the photoelectric elements is smaller than the light receiving section.

4. The component according to claim 1, wherein
   the second pad is arranged on the upper surface of the substrate; and
   the groove section is formed so that the first pad and the second pad form a same plane.

5. The component according to claim 1, comprising:
   a plurality of the embedding groove sections, wherein
   a plurality of the photoelectric element arrays are arranged in parallel with each other and,
   the photoelectric element array is embedded into each of the plurality of the embedding groove section.

6. The component according to claim 1, further comprising:
   a third pad provided on a rear surface of the substrate, wherein
   the third pad is electrically connected to the second pad by a through hole formed to penetrate the substrate.

7. A comnonent of a radiation detector comprising:
   an embedding groove section provided on a part of a substrate;
   a photoelectric element array, which includes a plurality of photoelectric elements for receiving light that are arranged in a one-dimensional array, and which is embedded into the embedding groove section;
   a first pad arranged on each of light receiving surfaces of the photoelectric elements; and
   a second pad provided on the substrate to correspond to the first pad, and electrically connected to the first pad, wherein
   a differential value between a depth of the groove section and a thickness of the photoelectric element array is not less than 1 $\mu$m and not more than 100 $\mu$m.

* * * * *